(12) United States Patent
Gibson et al.

(10) Patent No.: US 7,892,407 B2
(45) Date of Patent: Feb. 22, 2011

(54) SYSTEM AND SUB-SYSTEMS FOR PRODUCTION AND USE OF HYDROGEN

(75) Inventors: Thomas L. Gibson, Utica, MI (US); Nelson A. Kelly, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 702 days.

(21) Appl. No.: 11/156,993

(22) Filed: Jun. 14, 2005

(65) Prior Publication Data
US 2006/0065302 A1      Mar. 30, 2006

Related U.S. Application Data

(60) Provisional application No. 60/581,077, filed on Jun. 18, 2004.

(51) Int. Cl.
C25B 9/04      (2006.01)
C25B 1/10      (2006.01)

(52) U.S. Cl. ............ 204/228.1; 205/337; 205/340; 205/628; 205/637; 204/252

(58) Field of Classification Search ........... 205/637, 205/628, 337, 340; 204/252, 228.1
See application file for complete search history.

(56) References Cited

U.S. PATENT DOCUMENTS

| | | |
|---|---|---|
| 3,696,286 A | 10/1972 | Ule |
| 4,011,149 A | 3/1977 | Nozik |
| 4,021,323 A | 5/1977 | Kilby et al. |
| 4,341,204 A | 7/1982 | Bloxsom |
| 4,341,607 A | 7/1982 | Tison |
| 4,466,869 A | 8/1984 | Ayers |
| 4,528,252 A | 7/1985 | Yamazaki |
| 4,778,579 A | 10/1988 | Levy et al. |
| 5,512,145 A * | 4/1996 | Hollenberg ......... 205/628 |
| 5,879,828 A | 3/1999 | Debe et al. |

(Continued)

FOREIGN PATENT DOCUMENTS

DE      19533097      3/1997

(Continued)

OTHER PUBLICATIONS

Muhida et al. "A maximum power point tracking for photovolotaic-SPE system using a maximum current controller", Solar Energy Materials & Solar Cells, 2003, vol. 75, pp. 697-706.

(Continued)

*Primary Examiner*—Alexa D. Neckel
*Assistant Examiner*—Nicholas A. Smith
(74) *Attorney, Agent, or Firm*—Harness, Dickey & Pierce, P.L.C.

(57) ABSTRACT

A method for optimizing the efficiency of a solar powered hydrogen generation system is disclosed. The system utilizes photovoltaic modules and a proton exchange membrane electrolyzer to split water into hydrogen and oxygen with an efficiency greater than 12%. This high efficiency for the solar powered electrolysis of water was obtained by matching the voltage generated by photovoltaic modules to the operating voltage of the electrolyzer. Optimizing PV-electrolysis systems makes solar generated hydrogen less expensive and more practical for use as an environmentally clean and renewable fuel.

31 Claims, 9 Drawing Sheets

U.S. PATENT DOCUMENTS

| | | |
|---|---|---|
| 5,923,158 A | 7/1999 | Kurokami et al. |
| 6,136,412 A | 10/2000 | Spiewak et al. |
| 6,198,037 B1 | 3/2001 | Nakata |
| 6,319,293 B1 | 11/2001 | Debe et al. |
| 6,410,180 B1 | 6/2002 | Cisar et al. |
| 6,423,203 B1 | 7/2002 | Faita et al. |
| 6,519,951 B2 | 2/2003 | Ovshinsky et al. |
| 6,569,298 B2 | 5/2003 | Mérida-Donis |
| 6,610,193 B2 | 8/2003 | Schmitman |
| 6,613,215 B2 * | 9/2003 | Molter et al. ............... 205/628 |
| 6,619,283 B2 | 9/2003 | Ghela |
| 6,666,961 B1 | 12/2003 | Skoczylas et al. |
| 7,411,308 B2 * | 8/2008 | Parmley ..................... 290/1 R |
| 2002/0047085 A1 * | 4/2002 | Sumiya ................... 250/203.4 |
| 2002/0063552 A1 * | 5/2002 | Arakawa .................... 323/237 |
| 2005/0006391 A1 | 1/2005 | Krueger |
| 2005/0036570 A1 | 2/2005 | Kwak et al. |
| 2005/0178427 A1 | 8/2005 | Kelly et al. |

FOREIGN PATENT DOCUMENTS

| | | |
|---|---|---|
| JP | 61096094 | 5/1986 |
| JP | 04013880 | 1/1992 |

OTHER PUBLICATIONS

Tani et al. "Optimization of Solar Hydrogen Systems Based on Hydrogen Production Cost", Solar Energy, 2000, vol. 68, No. 2, pp. 143-149.

Fahrenbruch et al. "Fundamentals of Solar Cells", Academic Press, New York, 1983, pp. 505-511.

HOGEN®RE Hydrogen Generators, Enabling Zero Emissions Hydrogen Supply, Proton Energy Systems® Transforming Energy™, 3 pgs, http://www.protonenergy.com/index.php/html/energysystems/home/index.html, Jun. 2, 2004.

* cited by examiner

SYSTEM AND SUB-SYSTEMS FOR PRODUCTION AND USE OF HYDROGEN

CROSS-REFERENCE TO RELATED APPLICATIONS

This application claims the benefit of U.S. Provisional Application No. 60/581,077, filed on Jun. 18, 2004 and application U.S. Ser. No. 11/049,213, now U.S. Pat. No. 7,510, 640, filed on Feb. 2, 2005, entitled "Method and Apparatus for Hydrogen Generation" which claims priority to U.S. Provisional Application 60/545,379, filed on Feb. 18, 2004. The disclosure of the above applications is incorporated herein by reference.

FIELD OF THE INVENTION

The present invention generally relates to hydrogen production and, more particularly, to a system and method of producing hydrogen utilizing photovoltaic cells to power a membrane electrode assembly to electrolyze water to form hydrogen.

BACKGROUND OF THE INVENTION

Currently the major process by which hydrogen is produced is by the steam reforming of methane. Another means of making hydrogen is by the electrolysis of water. The electricity required for electrolysis is mainly derived from the electric power grid, and the predominant source of grid electricity, combustion of fossil fuels, generates emissions, such as nitrogen oxides and particulate matter, as well as carbon dioxide. One way to eliminate such emissions is to use solar generated electricity to electrolyze water to make hydrogen. Presently, efforts are directed toward improving the efficiency, durability, and cost of the solar powered hydrogen production processes.

Photovoltaic (PV) or solar cells can be used to supply the electricity necessary for the electrolysis of water. A single solar cell is the smallest unit of a photovoltaic system and usually has to little voltage to drive electrolysis. A group of solar cells called a photovoltaic module are electrically connected together in series and/or in parallel to supply sufficient voltage and current for various uses. Modules are normally encapsulated in a transparent, waterproof structure. However, systems consisting of solar cells in PV modules to make electricity together with electrolyzers to dissociate water into hydrogen and oxygen, as they exist today, cannot produce hydrogen as cheaply as the steam reforming of methane. Several projects have attempted to produce hydrogen gas to supply vehicle-fueling stations by using electricity from photovoltaic modules and commercially available electrolyzers to split water. These projects proved unsatisfactory due to the low efficiency and high cost of the combined technology, which only converted about 2%-6% of the solar energy to hydrogen fuel energy, thus, greatly increasing capital costs, the resulting hydrogen fuel cost (at least $15 per kilogram of hydrogen), and the large area covered by the system. That technology was based on non-optimal PV and electrolyzer combinations, and involved large land areas for collecting sufficient solar energy.

Other methods for converting solar energy into hydrogen are disclosed in co-assigned U.S. Provisional Application 60/545,379, filed on Feb. 18, 2004; and application U.S. Ser. No. 11/049,213, filed on Feb. 2, 2005, entitled "Method and Apparatus for Hydrogen Generation" and in Provisional Patent Application U.S. Ser. No. 60/545,374, filed on Feb. 18, 2004, and application U.S. Ser. No. 11/046,572, filed on Jan. 28, 2005, entitled "Hydrogen Generator Photovoltaic Electrolysis Reactor System", which are incorporated herein by reference. These apparatuses describe the optimization of the solar-cell powered electrolysis of water to produce hydrogen using electrolysis cells in reactors containing a liquid alkaline electrolyte. Each of those cells produces about one gram (12 L at STP) of hydrogen per day. It was found that a specific optimum operating voltage for an electrolyzer cell using Ni and Ni—$RuO_2$ plates for the cathode and anode respectively, and with a 5 M KOH electrolyte solution existed which was approximately 2.0-2.5 volts which must be matched by the maximum power point voltage, ($V_{mpp}$) of the PV system.] [Note: Whenever, the electrical units, volts, amps, etc. are used anywhere in this document, the electrical units are of direct current (DC) and not alternating current (AC).] While a significant improvement over previous systems, these small tank or bag reactors are relatively bulky and would need to be scaled up by several hundred-fold to fuel one fuel cell vehicle.

SUMMARY OF THE INVENTION

To overcome the disadvantages of the prior art, a method for designing and operating a PV-electrolyzer system (solar hydrogen generator or solar powered electrolysis system) having at least one photovoltaic (PV) module is provided. The system and method utilize at least one PV module, supplying power to electrolyze water to produce hydrogen.

A system is disclosed herein for the production and use of hydrogen. This system has at least one photovoltaic ("PV") module supplying power to electrolyze water and at least one electrolyzer receiving the power. The electrolyzer has at least one membrane electrode assembly ("MEA") for electrolyzing water to form hydrogen. The MEA is formed of a proton exchange membrane ("PEM") sandwiched between respective first and second catalyzed electrodes. The supply voltage of the PV module is matched to the operating voltage and current requirements of the electrolyzer.

In one embodiment of the invention, the system is formed of at least one photovoltaic ("PV") module having at least one PV cell supplying power to electrolyze water, and an electrolyzer receiving the power. The electrolyzer has at least one MEA. The system is optimized in a first mode, which has a PV subsystem designed to give the optimum voltage (that operating voltage which gives the maximum solar energy to hydrogen conversion efficiency) for the electrolyzer. In the first mode, the PV subsystem is directly connected to the electrolyzer subsystem. The system is further operable in a second mode by stepping-down the voltage of a non-optimum PV system to the optimum voltage when the voltage of the PV module exceeds the voltage target of the electrolyzer. The system is further operable in a third mode by stepping-up the voltage when the voltage of the PV module is less than the operating voltage of the electrolyzer. In the second and third modes, the PV voltage is stepped by adding DC-DC converters to the circuit.

A PV-electrolyzer can be built to operate at maximum efficiency in the first mode with a PV system directly connected to an electrolyzer. An optional controller can be added to the PV-electrolyzer system that switches among the first, second and third modes based upon an extent of light incident on the PV module. The voltage supplied by the PV system through the controller is a target range defined by an operating voltage range that gives the maximum efficiency for the stack.

A method is additionally disclosed for optimizing the design of PV-electrolyzer systems, which consists of a photovoltaic (PV) subsystem having at least one solar cell or PV module and an electrolyzer subsystem having at least one electrolysis cell or membrane electrode assembly (MEA) for electrolyzing water to generate hydrogen. The method includes: a) determining the operating voltage, operating current, and efficiency of the electrolyzer subsystem by measurements and calculations, b) determining a maximum power point voltage ($V_{mpp}$) for said PV cell based on a predetermined relationship between actual voltage and actual current under a plurality of loads and a plurality of voltages for said PV cell, and c) determining a number of PV cells at said $V_{mpp}$ to achieve a desired voltage to electrolyze water and satisfy required electrolysis system losses.

The system provides a practical, non-polluting technology for producing hydrogen fuel using photovoltaic semiconductor materials, an electrolyzer, and sunlight, to produce hydrogen. This hydrogen can be used to power fuel cell vehicles and stationary power generation at a cost competitive with other energy sources. In this regard, the invention provides a system for production of renewable hydrogen on a practical scale for essentially any application and including vehicle fueling and stationary power generation.

Further areas of applicability of the present invention will become apparent from: the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENT

Figure 1:
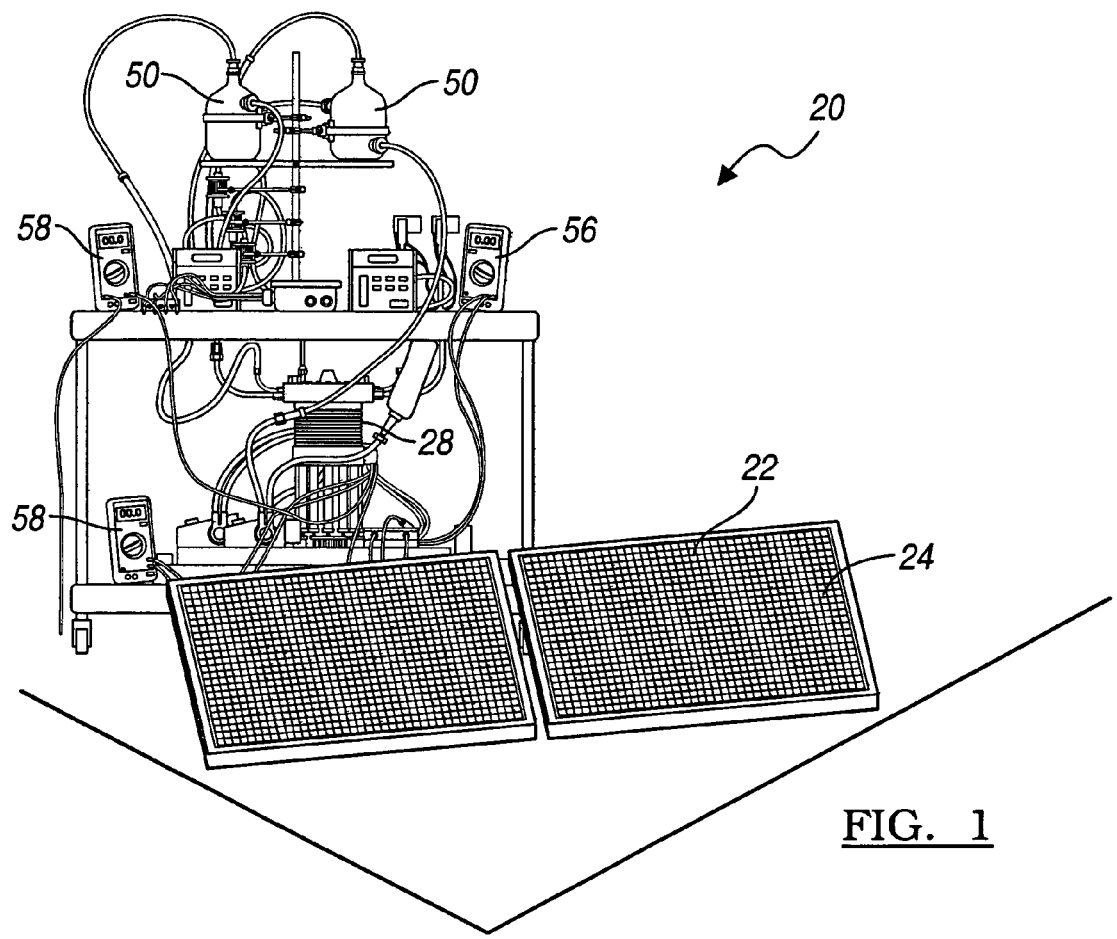
FIG. 1 represents a PV-electrolyzer system according to the teaching of the present invention.
Figure 2:
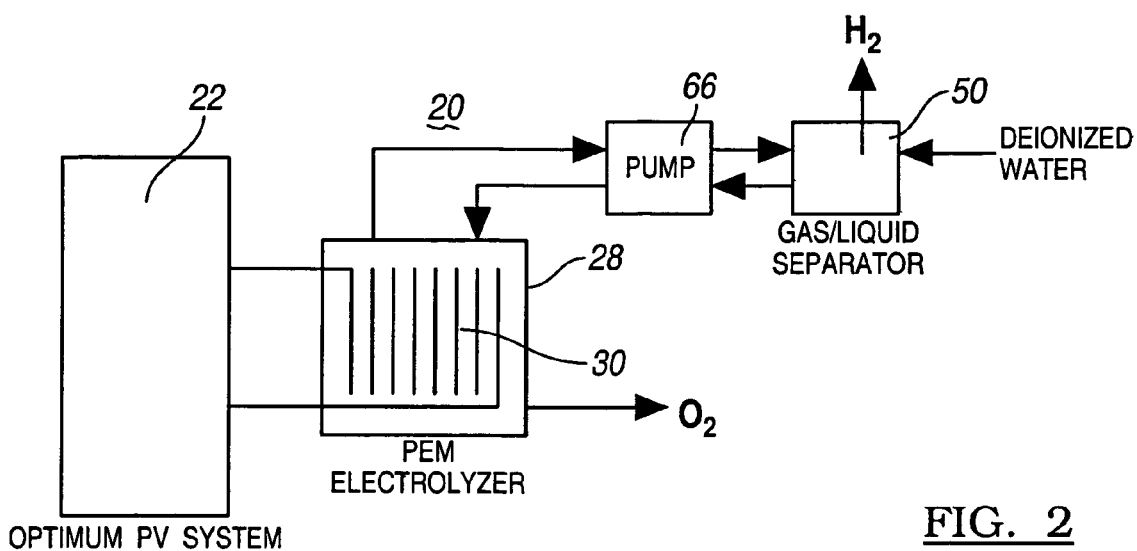
FIG. 2 is a schematic for a PV electrolyzer system with direct connection optimization (DCO)
Figure 3:
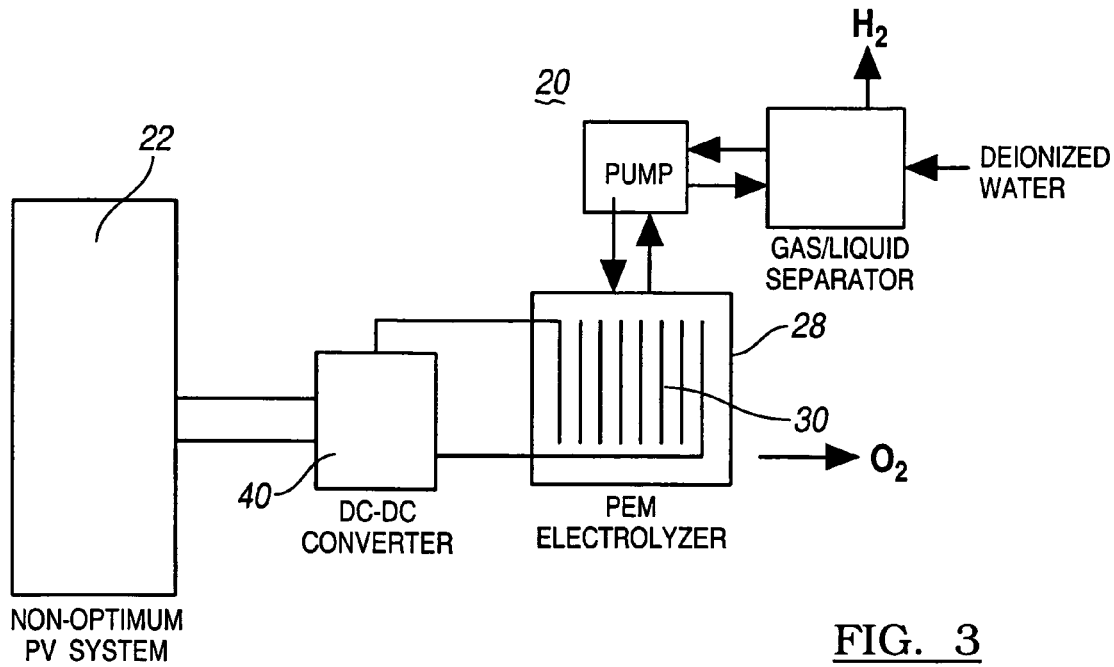
FIG. 3 is a schematic for a PV-electrolyzer system with DC-DC converter (DDC) optimization.
Figure 4:
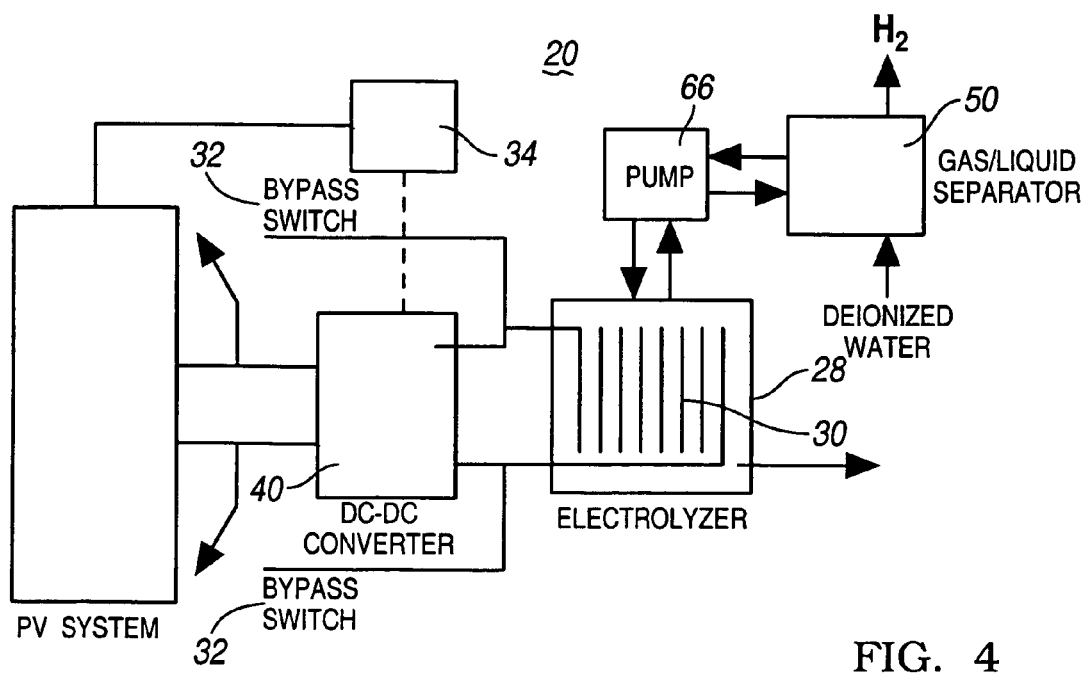
FIG. 4 is a schematic for a PV-Electrolyzer system capable of either DCO or DDC optimization.

Operation of the PV-electrolyzer system is explained with general reference to FIGS. 1 and 2, which represent a diagram and schematic of the system according to the teachings of the present invention. The PV-electrolyzer system 20 has a photovoltaic (PV) subsystem 22 having at least one solar or PV cell 24 or PV subsystem 22 and an electrolyzer subsystem 28 having at least one electrolysis cell or membrane electrode assembly (MEA) 30 for electrolyzing water to generate hydrogen. The electrolysis cell 30 is preferably a high efficiency Proton Exchange Membrane (PEM) sandwiched between two catalyzed electrodes to form a membrane electrode assembly (MEA). The voltage and current requirements of the electrolyzer subsystem 28 are matched with the voltage of the electricity produced by the solar powered photovoltaic ("PV") subsystem 22 to significantly increase the operating efficiency of the overall system 20. As described below in detail, the system 20 optionally utilizes a high pressure electrolyzer cell 30 to increase the output pressure of the hydrogen. With reference to FIG. 3, a DC-DC converter 40 may optionally be used to increase the overall system efficiency when the PV subsystem 22 alone does not give a voltage matching the operating voltage of the electrolyzer subsystem 28. The system 20 in FIG. 2 utilizes direct connection optimization (DCO) or utilizes the DC-DC converter 40 in FIG. 3 to vary the voltage supplied to the electrolyzer subsystem 28 to utilize DC-DC converter optimization (DDC). With reference to FIG. 4, a controller 34 may optionally be used in combination with a DC-DC converter to switch the circuit between DCO and DDC operation based on the light intensity detected by the controller to improve efficiency under low light conditions.

In order to scale up a PV electrolyzer system 20 to a size capable of fueling one or more fuel cell vehicles, a series of commercially available solar modules were tested with a range of efficiencies and a wide range of voltage outputs. The use of a PEM electrolysis cell 30 provides a very compact electrolyzer subsystem 28 with no need for handling acid or base, such as potassium hydroxide (KOH) necessary in some electrolyzers. In addition, any advances in efficiency and cost reduction for PEM fuel-cells will likely lead to further improved PEM electrolyzer cells 30. As described below, the high pressure electrolyzer cell 30 can optionally be configured to provide compressed hydrogen without the need for an external compression system.

FIG. 2 is a schematic of the PV-electrolyzer system 20 utilizing direct connection optimization (DCO). As shown, a PV subsystem 22 is directly connected to the PEM electrolyzer 28. This electrolyzer utilizes the current from the PV subsystem 22 to split deionized water into $H_2$ and $O_2$. While the oxygen in the system is vented to the atmosphere, the hydrogen is separated using a gas to liquid separator 50. Deionized water is provided to the electrolyzer cell 30 by an external system to make up for water consumed by electrolysis. A pump 66 is used to circulate deionized water through the electrolyzer and gas/water separation system. Water circulation both cools the electrolyzer and helps to separate and collect the hydrogen gas. As further described in detail below, the voltage of the maximum electrical output of the PV subsystem 22 is matched with the optimum operating voltage and current needed by the electrolyzer subsystem 28.

A schematic of a PV-electrolyzer system 20 with a DC-DC converter (DDC optimization) is shown in FIG. 3. The electrolyzer subsystem 28 in FIGS. 2 and 3 are represented schematically by only seven electrolysis cells 30 in series each with two electrodes. As is known, PEM electrolysis cells 30 have a cathode where hydrogen is produced and an anode where oxygen is produced. The actual electrolyzer subsystem 28 used in the testing of this invention has 20 cells. The system 20 can have an electrochemical stack having a plurality (any number) of the electrolysis cells 30. It is also envisioned that the electrochemical stack can be operable in a first mode to electrolyze water to produce hydrogen and is further operable in a second mode to consume hydrogen to produce power.

As seen in FIG. 4, the system 20 can optionally be optimized to a first mode, which utilizes a PV subsystem designed with a target operating voltage to obtain maximum conversion efficiency from the electrolyzer subsystem 28. The system 20 in FIG. 4 is optionally operable in a second mode by step-down of voltage in a second operating condition when the voltage of the PV subsystem 22 exceeds the target optimum voltage of the electrolyzer subsystem 28. The system 20 is again optionally operable in a third mode by step-up of voltage in a third operating condition when the voltage of the PV subsystem 22 is less than the voltage target of the electrolyzer subsystem 28. The controller 34 functions to adjust among the first, second and third modes based upon an extent of light incident on the PV subsystem 22. The optimum voltage target is a target range defined by an operating voltage range required by the electrolyzer subsystem 28 that obtains the maximum power and efficiency from the PV subsystem and obtains the maximum efficiency from the electrolyzer subsystem 28.

Additionally, the system 20 utilizes a method for configuring and operating a PV-electrolysis system having at least one photovoltaic (PV) cell 24 that supplies power to electrolyze water to produce hydrogen. The method begins by determining the required hydrogen production rate (and size of the electrolyzer). The operating voltage and operating current of the electrolyzer are then measured or calculated. The PV system will then be designed to match the operating voltage and current of the electrolyzer system. The necessary output of the PV system is found by first determining a maximum power point voltage ($V_{mpp}$) for the PV system 22 based on a predetermined relationship between actual voltage produced by each PV cell 24 and actual current under load for the PV cell 24. The number of PV cells 24 electrically connected in series at the $V_{mpp}$ needed to achieve a desired voltage to electrolyze water and satisfy required electrolysis subsystem system losses is then determined.

Optionally, the system 20 has a number of PV cells 24 in series configuration to supply a voltage sufficient to electrolyze water and satisfy electrolysis system losses based on a maximum power point voltage of the subsystem 22. The number of PV cells 24 to be connected in series and constitute the PV subsystem 22 is determined as is the number of electrolysis (MEA) cells 30 arranged in series in a stack to provide a desired electrolyzer operating voltage. The number of PV cells 24 in series at the $V_{mpp}$ to achieve a desired voltage to electrolyze water and satisfy electrolysis system losses (the electrolyzer overvoltage) are determined. The PV subsystem 22 shown has an overall $V_{mpp}$ in a range of 32 to 39 volts supplying power to the electrolyzer subsystem 28 having twenty PEM electrolysis cells 30 in series. This $V_{mpp}$ also corresponds to an open circuit voltage in a range of about 40 to 46 volts for operating the electrolyzer with twenty PEM electrolysis cells 30 in series. The PV subsystem 22 has an overall $V_{mpp}$ sufficient to provide 1.6 to 2.0 volts per each of the MEAs. Preferably, the PV subsystem 22 has an overall $V_{mpp}$ of about 36 volts for a 20-MEA electrolyzer subsystem 28, which is equivalent to about 1.8 volts per each PEM electrolysis cell 30.

The $V_{mpp}$ is formed by a series of PV cells 24 wired in series with each of the PV cells 24 having an output of about 0.50 volts at the maximum power point. The PV subsystem 22 has a cluster of PV cells 24 in series, that contains 72 cells. The desired PV subsystem voltage is about 36 volts at the maximum power point. Similarly, the plurality of these PV subsystems 22 can be arranged in parallel to provide the desired amount of current. To design an optimum PV subsystem for PV-electrolyzer system 20, a target of 1.8 volts per electrolysis cell or a range of 1.6-1.8 volts per electrolysis cell should be used.

The system 20 is optionally configured such that the operating voltage for hydrogen production is proportional to the number of PEM electrolysis cells 30. The necessary PV output voltage to electrolyze water and satisfy electrolysis system 20 losses (to provide the operating voltage of the electrolyzer) is based on the number of PV cells connected in series and a maximum power point voltage ($V_{mpp}$) of the individual PV cell 24. It is envisioned that the electrolyzer subsystem 28 can be formed of a plurality of electrolysis cells 30, which may be connected in series to accept a higher operating voltage ($V_{oper}$) and which may be connected in parallel to accept a higher operating current ($I_{oper}$). For DCO (mode 1) optimization, the number of PV (solar) cells in series in the PV subsystem determines the PV output voltage at the maximum power point ($V_{mpp}$) which must match the electrolyzer operating voltage ($V_{oper}$). The number of PV modules connected in parallel in the PV subsystem 22 determines the operating current.

The optimum PV subsystem 22 in FIG. 2 is designed to generate a predetermined voltage at its maximum power point ($V_{mpp}$) that approximately equals the operating voltage ($V_{oper}$) of the electrolyzer subsystem 28. The hydrogen generation optionally is optimized and achieves maximum efficiency under standard test conditions (STC—solar irradiance of 1000 W/m$^2$ and 25° C.). For example, a PV subsystem 22 with a $V_{mpp}$ of 36 volts and a solar to electrical efficiency of 17.5% (under STC at its maximum power point), connected to a high efficiency PEM electrolyzer with a $V_{oper}$ of 32 to 38 volts, can generate hydrogen with 11% to 12% solar to hydrogen efficiency. Additionally, the hydrogen generation can be optimized to achieve maximum efficiency based upon average geographic specific solar irradiance. In this way, the configuration of the PV subsystem 22 can be designed to match an electrolyzer subsystem 28 to provide needed hydrogen production at a targeted geographic locations or designed for general use within larger market areas. The design and manufacture of PV subsystem 22 in FIG. 2 can be optimized by selective series or parallel arrangements of PV (solar cells) or modules to produce the optimum $V_{mpp}$ and operating current to match the $V_{oper}$ and current needs of the PEM electrolyzer 28. This configuration can be adapted depending on calendar or atmospheric conditions and the flow rate of hydrogen required (which is a function of the current).

Optionally, the non-optimum system 20 in FIG. 3 requires coupling to a DC-DC converter system 40, to convert the non-optimum PV voltage to the optimum PV voltage equal to $V_{oper}$ of the electrolyzer. The system 20 can also be designed with selective series or parallel arrangements of PV subsystems 22. It may be necessary to put a plurality of PV subsystems in parallel to get enough current to make the desired hydrogen fuel for a high-use application, such as a car fueling operation. In FIG. 4, moving from DCO to DDC circuitry or seasonal adjustments and re-optimization of the system may be accomplished by making changes from parallel to series connections or vice versa. To make these changes from parallel to series connections, a systematic reconnect of the PV cables to the PV-electrolyzer system can be performed manually by reconnecting PV cells, modules, or subsystems or may be done in real time depending on light and seasonal conditions using the controller 34.

Preferably, the PV subsystem 22 has a predetermined output voltage range ($V_1$ to $V_2$) of approximately 1.6 to 2.0 volts per electrolysis cell 30. In this voltage range, the PV subsystem generates 95% to 100% of its $P_{max}$ with 95% to 100% of its maximum electrical efficiency, and the hydrogen generation efficiency of the system is approximately 85% to 100% of the maximum hydrogen generation efficiency. The electrolyzer subsystem 28 has a characteristic $V_{oper}$ determined by measuring the voltage drop across the poles of the electrolyzer with a voltmeter 56. $V_{oper}$ of the electrolyzer subsystem determines the optimum PV output voltage (at the maximum power point) required for system 20 operation and also determines the efficiency of the electrolyzer, which is equal to $100\% \times (N \times 1.23 \text{ volts}/V_{oper})$. Thus, the voltage range $V_1$ to $V_2$ per electrolysis cell is the optimum voltage range for the PV subsystem 22 when directly connected to an efficient electrolyzer subsystem. $V_1$ to $V_2$ per electrolysis cell is also the optimum voltage output for a DC-DC converter system when a DDC system is utilized for PV-electrolysis. Additionally, the electrolyzer subsystem 28 has a characteristic $V_{oper}$ determined by its number (N) of electrolysis cells 30 in series and the characteristic overvoltage of each MEA ($V_{ov}$) such that:

$$V_{oper} = N \times (1.23 \text{ volts} + V_{ov})$$

in which $V_{ov}$ ranges from approximately 0.4 to 0.7 volts depending on the operating current, electrode type, electrode design, catalyst type, catalyst loading, $I_{oper}$, operating temperature, and operating pressure of the electrolyzer subsystem 28.

Returning briefly to FIG. 3, it is envisioned that a non-optimum PV subsystem 22 can be connected to a DC-DC converter 40 (a linear current booster or charge controller) designed to convert the non-optimum voltage output of the PV subsystem 22 to the predetermined $V_{oper}$ of the electrolyzer subsystem 28, and the DC-DC converter 40 is connected to supply power to operate the electrolyzer subsystem 28. In this regard, the PV subsystem 22 is connected to a DC-DC converter 40 designed to convert the voltage output of the PV subsystem 22 to the optimum voltage (e.g. 1.6 to 2.0 volts) per electrolysis cell 30 (the predetermined $V_{oper}$ per cell of a high efficiency PEM electrolyzer subsystem).

The control system or algorithm running in a controller 34 is utilized to switch the PV subsystem 22 between direct connection to the electrolyzer subsystem and connection to the electrolyzer subsystem 28 through a DC-DC converter 40. The DC-DC converter 40 is designed to convert the voltage output of the PV subsystem 22 to the $V_{oper}$ of the electrolyzer subsystem 28 and switching is controlled by a decrease in solar irradiance detected by a sensor system.

In another particular embodiment of the invention, the PV subsystem 22 is configured to generate a predetermined voltage at its maximum power point ($V_{mpp}$) that approximately equals the operating voltage ($V_{oper}$) of the electrolyzer subsystem 28 when the electrolyzer operating current is less than or equal to 15 A, so that the hydrogen generation is optimized and achieves maximum efficiency under standard test conditions (STC—solar irradiance of 1000 W/m$^2$ and 25° C.). Under these operating conditions, A system 20 consisting of a PV subsystem with a $V_{mpp}$ of 36 volts and a solar to electrical efficiency of 17.5% (under STC at its maximum power point), connected to a high efficiency PEM electrolyzer with a $V_{oper}$ of 32 to 33 volts has been found to generate hydrogen with 12.4% solar to hydrogen efficiency.

Each PV cell 24 has a crystalline silicon (c-Si) based or an amorphous silicon based semiconductor material or a combination of both c-Si and a-Si based materials which may be applied in layers. Table 1 shows the optional PV subsystems 22 which have been tested. Manufacturer, stated area, efficiency, open circuit voltage ($V_{oc}$), short circuit current ($I_{sc}$), maximum power point voltage ($V_{mpp}$), maximum power point current ($I_{mpp}$), and maximum power ($P_{max}$) are also shown. This set of solar modules provides a range of input voltages ($V_{mpp}$=17 to 54 volts). $V_{mpp}$ is a key variable affecting the efficiency of the coupling of solar modules to an electrolysis cell using Ni and Ni—RuO$_2$ plates and an alkaline electrolyte (U.S. Provisional Application 60/545,379, filed on Feb. 18, 2004; and application U.S. Ser. No. 11/049,213, filed on Feb. 2, 2005, entitled "Method and Apparatus for Hydrogen Generation"). Modules 3 and 12 used mono-crystalline cells. Modules 8 and 9 used multicrystalline silicon. Modules 10 and 11 used a blend of amorphous silicon and crystalline silicon. Modules 13 and 16 used single-crystal silicon cells. The cells had efficiencies ranging from 11.5 to 17.5%, while the solar to electricity efficiencies of the modules ranged from 10.6 to 15.2%. Cell area and efficiency refer to the actual silicon PV material that can generate electrical current. Module area and efficiency refer to the entire surface of the PV subsystem including "dead spaces" around the solar cells as far as the outer edge of the module frame. The module efficiency is always lower than the cell efficiency because it includes this inactive area in addition to the active area of the actual solar cells.

TABLE 1

Solar module characteristics.

| Module Number | Module Manufacturer | Model Number | $V_{oc}$ (V) | $I_{sc}$ (A) | $V_{mpp}$ (V) | $I_{mpp}$ (A) | Rated power, $P_{max}$ (W) | Module Effic. (%) | Module Area (m$^2$) | Cell Effic. (%) | Cell Area (m$^2$) |
|---|---|---|---|---|---|---|---|---|---|---|---|
| #3 | Shell | SQ-75 | 21.7 | 4.8 | 17.0 | 4.4 | 75 | 11.9 | 0.632 | 13.3 | 0.566 |
| #8, #9 | Sharp | ND-NOECU | 24.9 | 7.8 | 20.0 | 7.0 | 140 | 12.1 | 1.153 | 13.4 | 1.042 |
| #10 | Sanyo | HIP-J54BA2 | 66.4 | 3.7 | 54.0 | 3.3 | 180 | 15.2 | 1.181 | 17.3 | 1.040 |
| #11 | Sanyo | HIP-G751BA2 | 64.9 | 3.6 | 51.4 | 3.3 | 167 | 14.1 | 1.181 | 16.1 | 1.040 |
| #12 | Shell | SP-140-PC | 42.8 | 4.7 | 33.0 | 4.3 | 140 | 10.6 | 1.320 | 11.5 | 1.220 |
| #13 | Sharp | NT-185U1 | 44.9 | 5.6 | 36.2 | 5.1 | 185 | 14.2 | 1.301 | 17.5 | 1.057 |
| #16 | Sharp | NE-165U1 | 43.1 | 5.5 | 34.6 | 4.8 | 165 | 12.7 | 1.301 | 14.6 | 1.134 |

In the case where PV subsystems 22 are cost-effectively available at a non-optimized system design for a given light condition, then in the case of over-designed, that is, high voltage PV modules, the modules are coupled to a DC-DC converter for stepping down the output voltage. The high voltage PV subsystems 22 would have an advantage in saving "copper losses," and superior high or low voltage PV subsystems 22 might also be chosen because they have a superior efficiency based on their inherent solid-state qualities. "Copper losses" are losses that occur due to the circuit resistance in wiring and connections and are made worse when longer distances are connected. They can be reduced, or compensated for, by increasing the operating voltage of the system.

The electrolyzer subsystem 28 is designed to operate at low current density and elevated temperature to increase its efficiency. Additionally, the electrolyzer subsystem 28 is optionally designed to operate at a high pressure (5,000-15,000 psi) to supply compressed hydrogen fuel by electrochemical compression without a mechanical compressor. This configuration allows for the supply of hydrogen fuel by electrochemical compression in a form which is ready for storage and fueling fuel cell vehicles.

The electrolyzer subsystem 28 optionally has an acidic electrolyzer having an acidic electrolyte, a basic electrolyzer having a basic electrolyte, a steam electrolyzer, a PEM electrolyzer having at least one MEA, or a high-pressure electrolyzer. Preferably, the desired operating voltage is in range of 32 to 38 volts for a 20-MEA PEM electrolyzer, which is equivalent to about 1.6 to 1.9 volts per electrolysis cell 30.

When an optional high pressure electrolyzer cell 30 is used, higher voltages are needed to drive the hydrogen and oxygen evolution reactions, that is, for water electrolysis. The economic advantage of a high pressure electrolyzer 30 is based on a trade-off between sacrificing some efficiency in the electrolyzer 30 due to the higher voltage needed to electrolyze water at higher hydrogen and oxygen pressures as compared to the larger savings in downstream compression costs once hydrogen is evolved.

When high pressure hydrogen is needed, the high-pressure electrolyzer subsystem 28 disclosed herein is used instead of the currently available commercial lower-pressure PEM electrolyzer cell 30 that produces hydrogen with an outlet pressure of a few hundred psig. Hydrogen from the lower-pressure PEM electrolyzer 30 must be compressed mechanically in a piston, diaphragm, or other type of compressor to 10,000 psig or more for practical fueling and storage applications. The limited efficiency of motor driven mechanical compressors, thus, can cause severe losses in the energy efficiency of the overall fuel production and delivery system. The high-pressure electrolyzer subsystem 28 generates hydrogen and simultaneously raises its pressure to 10,000-15,000 psig using only a small fraction (approximately 6 to 9%) of the electrical energy input into the electrolyzer while eliminating the need for a motor-driven mechanical compressor.

Figure 10:
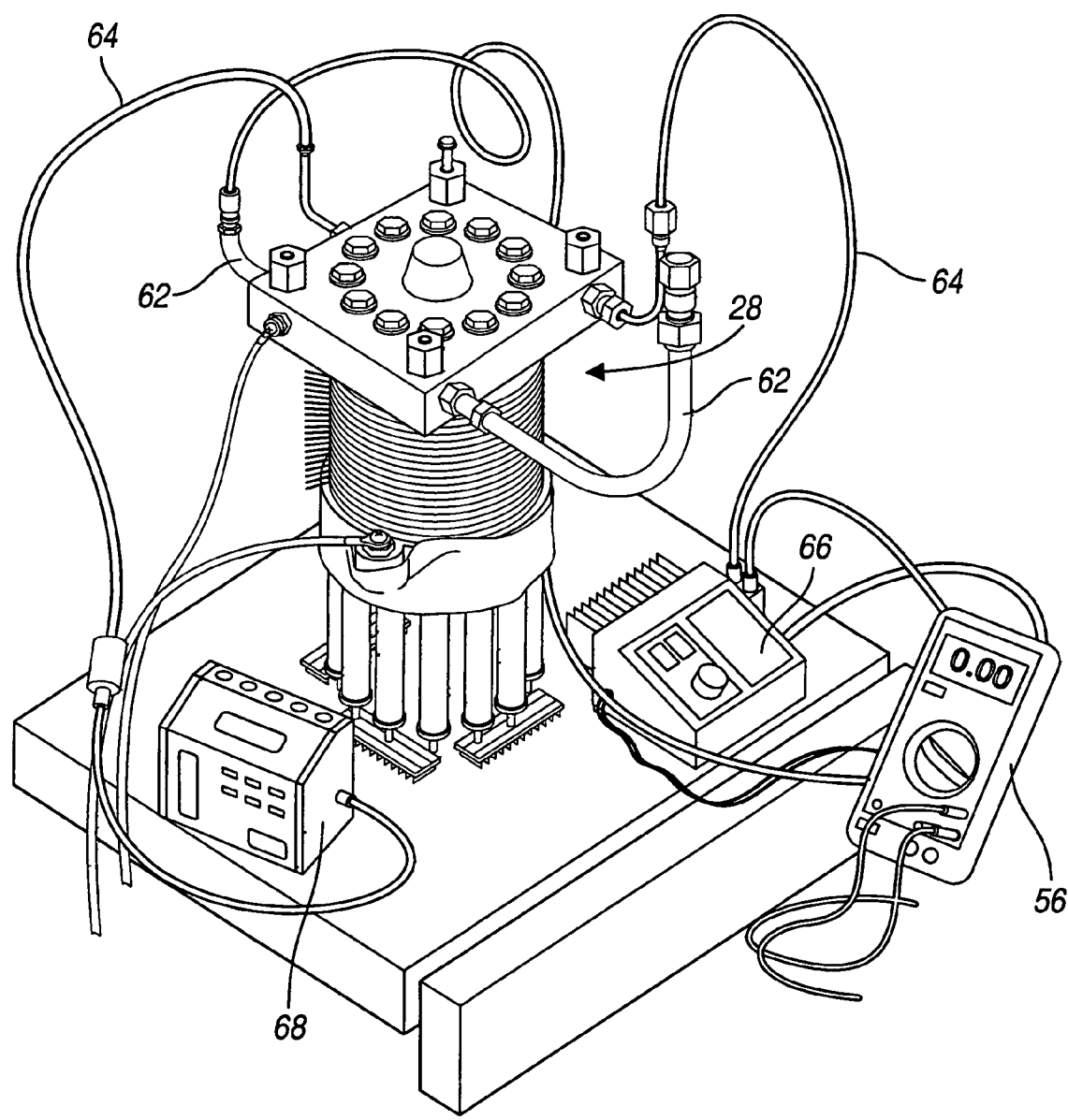
FIG. 10 represents a configuration for the electrolyzer.

The electrolysis cell 30 described herein has a proton transporting membrane sandwiched between two catalyzed electrodes. See, for example, commonly assigned U.S. Pat. Nos. 6,663,994, 6,566,004, 6,524,736, 6,521,381, 6,074,692, 5,316,871, and 5,272,017, each of which is incorporated herein by reference. A version of the PEM electrolyzer subsystem 28 was made by Proton Energy Systems, Inc. (Wallingford, Conn.). As shown in FIG. 10, the electrolyzer subsystem 28 has two electrical connections and four gas/water connections. Two gas/water connections are for the hydrogen 62 and two are for the oxygen 64. The electrolyzer subsystem 28 consists of 20 electrolysis cells 30 (membrane electrode assemblies) connected in series. At high current inputs (above about 12 A), the electrolyzer cells 30 also needs to have the circulating water for cooling to prevent the stack from heating up. The electrolyzer subsystem 28 uses a constant circulation of water to remove the hydrogen and oxygen from the stack. It appears that no circulation system is needed for a short time to operate the electrolyzer subsystem 28 at maximum efficiency at low current. However, pumps are needed to supply water that will be converted to hydrogen and oxygen and to cool the stack at high current. This liquid flow can also potentially improve the efficiency. It has been found that the PEM electrolyzer subsystem 28 could be used with or without a gas-liquid separator on the oxygen side of the cell since the oxygen was vented into the atmosphere.

Figure 11:
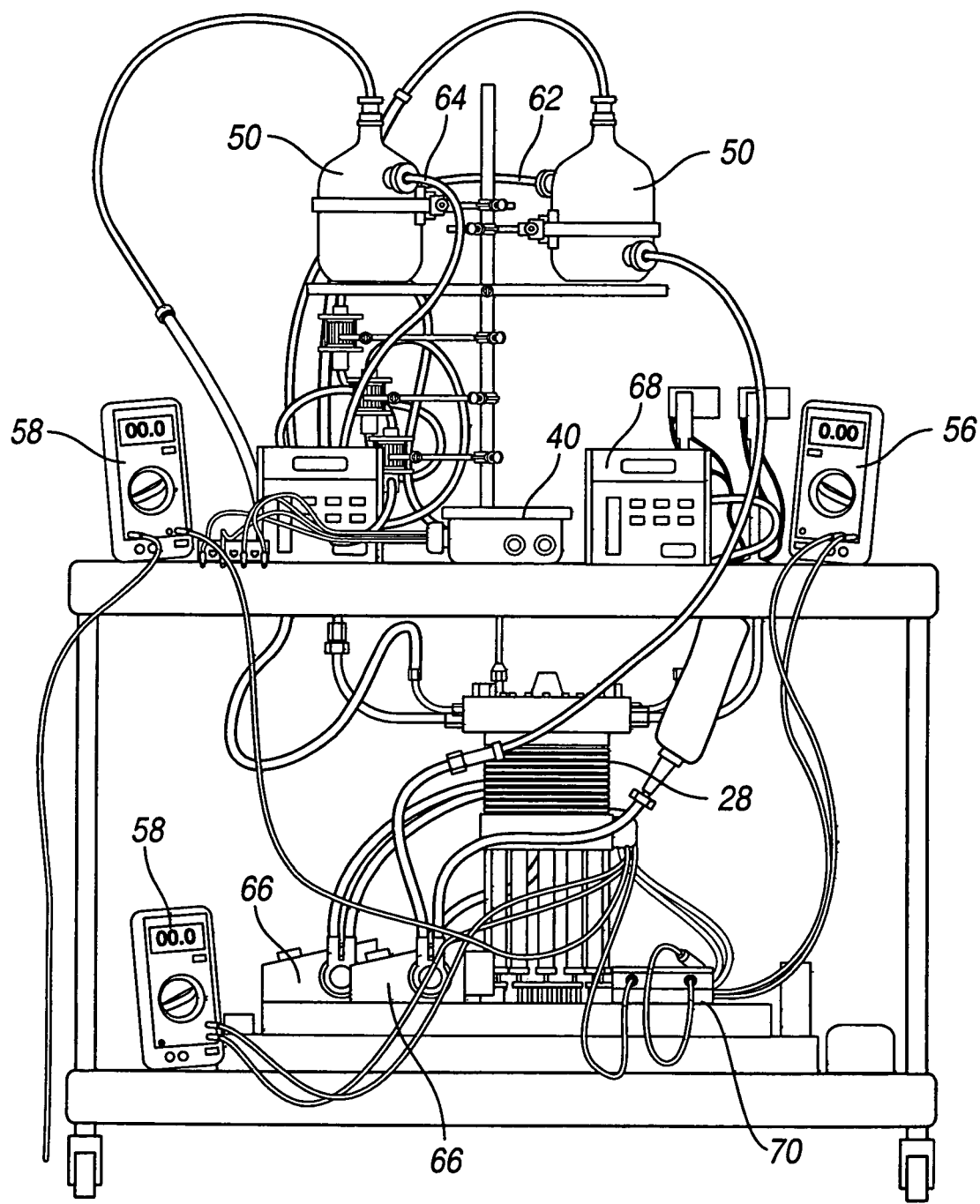
FIG. 11 represents electrolyzer system components except for the PV modules.

In FIG. 10, the $O_2$/water inlet and outlet tubes 62 are ½ inch stainless steel tubing. In this figure the $O_2$/water inlet 62 is closed off by a metal cap; later it was connected to a second water pump (not shown). The $O_2$ just escapes from the outlet into the air. The $H_2$/water inlet tubes 64 are smaller ¼ inch O.D. stainless steel tubing. In FIG. 11, the $H_2$/water inlet is shown connected to a water pump 66 that circulates the water through the PEM stack and then through a gas/water separator 50. The $H_2$ is sent to a flow meter 68. An ammeter 58 measures the current flow through the cables and the stack.

There are some major advantages to using a stack of PEM electrolyzer cells 30 versus alkaline electrolysis cells. The electrolyzer subsystem 28 has multiple electrolysis cells 30 in series, each cell 30 having closely spaced catalyst- (chiefly platinum- or ruthenium-) coated electrode plates separated by a solid electrolyte membrane to electrolyze deionized water. Alkaline electrolysis cells however consist of catalyst-coated electrodes immersed in tanks filled with an aqueous alkaline electrolyte such as aqueous potassium hydroxide. Because the electrolyzer subsystem 28 arranges many electrolysis cells 30 in a closely-spaced stack and circulates deionized water rapidly through the cells with the pump 66, the size, weight, and cost of the overall system can be sharply reduced. Further, risks associated with the use of large volumes of highly corrosive liquid, alkaline electrolyte are completely eliminated. The electrolyzer subsystem 28 can be made more compact than a series of wet electrolysis cells because the stack construction gives the electrolyzer higher current density and higher power density.

The DC to DC converter 40 ("DDC") is a device that changes an input voltage and current, $V_1$ and $I_1$, to an output voltage and current, $V_2$ and $I_2$. Its usefulness is in taking an input voltage from the PV subsystem 22 and optimizing or matching the DDC output voltage to the operating voltage of the load. For example, solar cells 24 have a maximum power point, $P_{max}$, where the product $V_1 \times I_1$ (or $V_{mpp} \times I_{mpp}$) is maximized. This voltage may not correspond to the operating voltage of the load (e.g., an electrolyzer load). Furthermore, as the intensity of sunlight changes, the current output of a PV subsystem 22 will change, and to a lesser degree, so will the voltage output. A DDC system can be programmed to track the maximum power point of the solar modules. The optimum efficiency of the PV-electrolyzer system 20 occurs when the DDC is designed so that the output voltage of the DDC is equal to the optimum operating voltage required by the electrolyzer subsystem 28. The electrolyzer subsystem 28 operates at a characteristic voltage that depends on design, operating current, and operating temperature effects. The electrolyzer design (materials, catalysts, electrode design, and membrane or electrolyte) determines its overvoltage and efficiency. The efficiency is highest when electrode current density is low and, therefore, decreases with increasing electrolyzer operating current. The characteristic operating voltage of the electrolyzer is the standard water splitting voltage of 1.23 volts plus the overvoltage.

Figure 12:
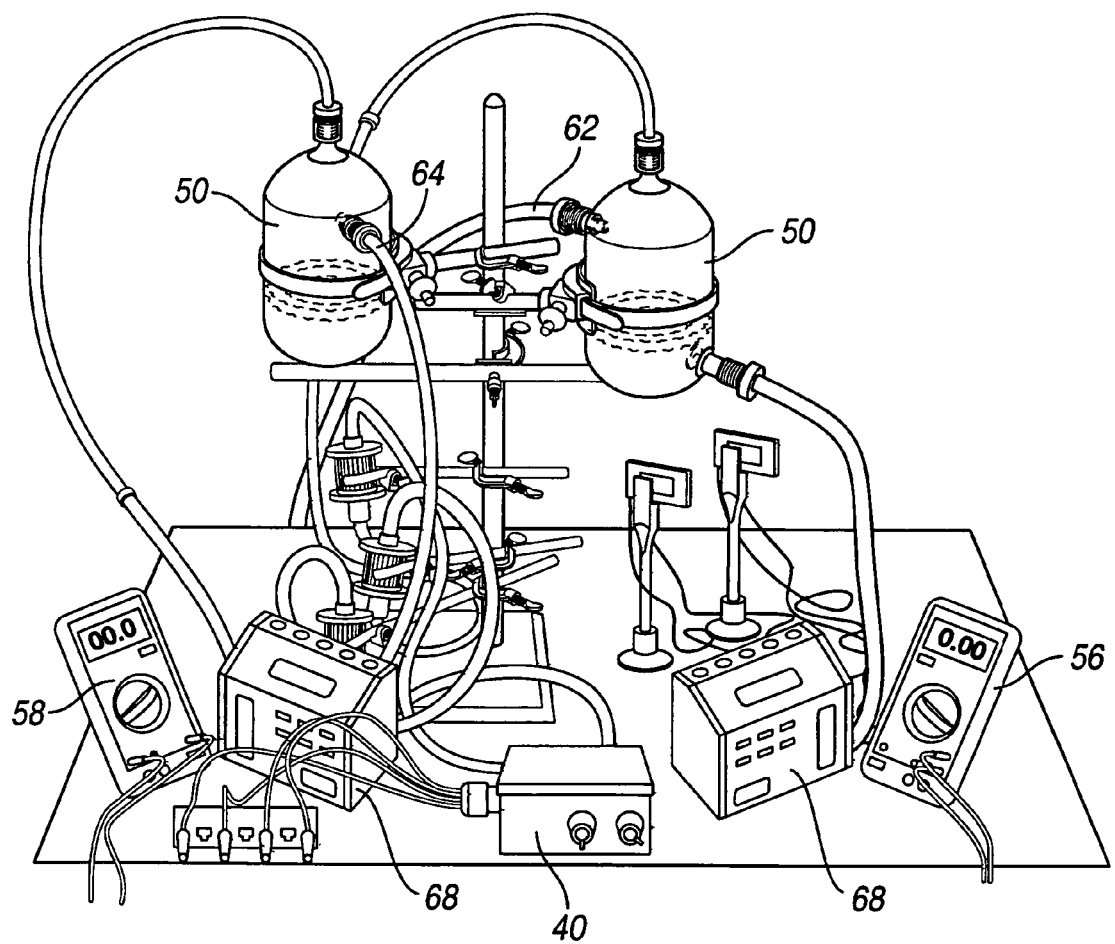
FIG. 12 represents details of a component of FIG. 13.
Figure 13:
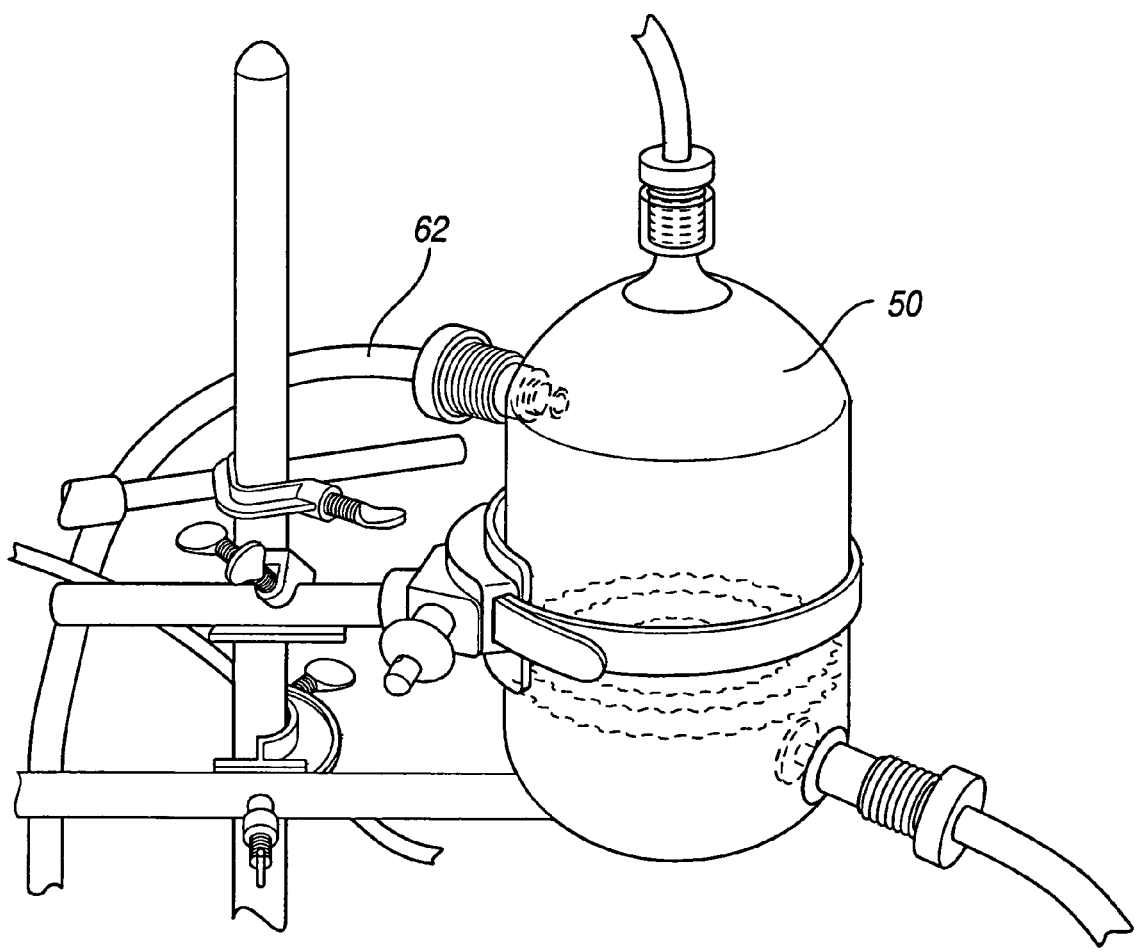
FIG. 13 represents details of a gas/water separator.

With reference to FIGS. 3, 11, and 12, two optional DDCs 40 were made to specifications: (1) a low input voltage model that put out a higher output voltage (but a lower current), sufficient to drive the electrolyzer; and (2) a high input voltage model that dropped the output voltage to drive the electrolyzer at its operating voltage and with an increased current. Both converters 40 were provided by Solar Converters Inc. (Guelph, Ontario). The low input voltage model was a modified Model CV20/33-20 special ordered with a potentiometer to manually adjust the output voltage. The high voltage model was a modified PPT48-10 special ordered to have potentiometers to manually adjust both the output voltage and current. Both DDC models 40 worked best with the potentiometers set at maximum.

These DC-DC converters 40 are also usable for applications where the solar modules power pump motors. The DC-DC converters 40 sacrifice some of the PV output voltage to supply higher currents so that the motor does not stall even under low light conditions. A controller 34 incorporating logic algorithms and set points can be added to the DDC system 40 so that it monitors the electrolyzer performance and makes adjustments to the output voltage and current to keep the solar module-electrolyzer system operating close to its maximum output. Software and hardware for PV system battery charge controllers can be adapted to the present invention for electrolyzers.

The DC-DC conversion ("DDC") optimization, also effectively increased the efficiency of solar hydrogen production. Selected PV subsystems 22 that did not match the voltage and current required for the electrolyzer subsystem 28 were connected to an adjustable DC-DC converter 40 controlled by one or more potentiometers to convert their electrical output to the optimum voltage and current required for the PEM electrolyzer subsystem 28. For PV subsystems 22 with a voltage too low for the electrolyzer, efficiency increased from zero to 9.5%. For PV subsystems 22 with voltage too high for efficient electrolysis, the method increased the efficiency from 9.0% to 10.5%.

The DDC optimization method may also improve solar hydrogen production on overcast, cloudy days when the efficiency of direct connection PV-electrolysis can be reduced due to a drop in the electrical output of the PV subsystem 22. Since the DC-DC converter is not 100% efficient (usually operating at 92-95% efficiency near its maximum current), use of a DC-DC converter 40 may reduce the efficiency of hydrogen production on sunny days. However, it has valuable benefits: 1) near sunrise, 2) near sunset, 3) on cloudy days, and 4) for PV systems with voltage outputs significantly above or below the optimum voltage for the electrolyzer load. Thus, the best PV-electrolysis system 20 is one that allows switching between DCO and DDC optimization by including adjustable DC-DC converters 40 in the circuit and bypass switches. The switching may be done manually or automatically by a controller 34 which is based on the solar irradiance detected by a sensor (not shown).

Some DC-DC converters 40 can stall when the electrolyzer stack is charged and acts as a fuel cell producing a back voltage against the DDC. This problem can be prevented by adding blocking diodes to the circuit, which prevent current from flowing from the cell stack back into the DDC. This prevents the DDC from stalling under such conditions as decreased PV output caused by increased clouds. This circuit would approximate a DC-DC converter 40 that is used in charging batteries using electricity from PV systems which is referred to as a charge controller. The charge controller wired to an electrolyzer subsystem 28 does not suffer from the stalling problems as do simpler DC-DC converters without diodes.

By designing a PV-electrolysis system 20 with PV subsystems 22, a PEM electrolyzer subsystem 28, DC-DC converters 40 and a switching panel 32 that can either bypass the converters or connect them to the electrolyzer subsystem 28, the present invention achieves both DCO and DDC optimization depending on the intensity of sunlight (FIG. 4). DCO is most useful in bright sunny weather when the system can reach its highest possible efficiency and hydrogen production rate, while DDC is advantageous because it can produce hydrogen with the greatest efficiency possible on in the early morning, the evening, and on partly cloudy and overcast days to raise the average hydrogen production rate.

Optionally, the PV-electrolysis system 20 can combine direct connection optimization (DCO) and DC-DC converter (DDC) optimization. When the bypass switches are closed, the system uses DCO, and when the switches are open, the system can use DDC optimization. When the PV-electrolyzer system is operated in the DCO mode, the PV subsystems in the PV system are connected in parallel and all have an optimum $V_{mpp}$ equal to the operating voltage required for the electrolyzer. For example, PV subsystems 22 with $V_{mpp}$=36 volts (Table 1, module #13) had the highest efficiency for the 20-cell PEM electrolyzer subsystem 28 tested. The PV subsystems 22 give approximately 95% or more of their maximum power in a voltage range of 32 to 39 volts around the $V_{mpp}$ of 36 volts. PV subsystem #13 gave the highest efficiency with the PEM electrolyzer because the optimum power range of the PV subsystems (32-39 volts) overlapped the operating voltage of the PEM electrolyzer (32-38 volts). DCO operation is most efficient in bright sunlight, but under low sunlight intensity the efficiency drops when the PV voltage drops below the minimum needed to split water in the electrolyzer.

When the PV-electrolyzer system 20 is operated in the DDC optimization: mode, which is most beneficial under cloudy and low-light intensity conditions, pairs of PV subsystems 22 (e.g., module #13 in Table 1) can best be connected in series to double the voltage of the PV system; for example, to $V_{mpp}$=72 volts, which will decrease so-called "copper losses" or voltage and current decreases due to resistance in the wiring. The higher voltage is then converted to the optimum voltage for the electrolyzer when passing through the DDC. A small amount of current is lost due to resistance in the DDC, which has an efficiency of 95% at low current to 92% at high current flow, but this loss can be offset by the improvement in efficiency gained by matching the necessary operating voltage of the electrolyzer subsystem 28. This gain is especially important under low light conditions or when the PV subsystem 22 has a low intrinsic $V_{mpp}$, conditions which could prevent the start of electrolysis, since the 20-cell PEM electrolyzer tested requires at least 30 volts to split water.

A series of experiments were conducted using eleven photovoltaic systems with voltages at the maximum power point ($V_{mpp}$) ranging from 17-105 volts. They were connected directly to the 20-cell PEM electrolyzer stack (Proton Energy Systems, Inc.) fitted with an external water circulation pump and gas separator as in the schematic and picture shown in FIGS. 1 and 2. These PV systems consisted of single PV subsystems or pairs of modules connected in series or parallel to give the desired test voltage. Irradiation was supplied by natural sunlight on a sunny day in April with a solar irradiance of 900-950 watts/m$^2$. The modules were pointed at the sun during testing to receive the maximum available irradiance. An ammeter 58 was placed in the circuit between the PV subsystem 22 and electrolyzer, and the sunlight intensity was monitored simultaneously using a calibrated crystalline silicon photodiode (UDT Sensors, Hawthorne, Calif.) with a known linear current response to sunlight.

Figure 5:
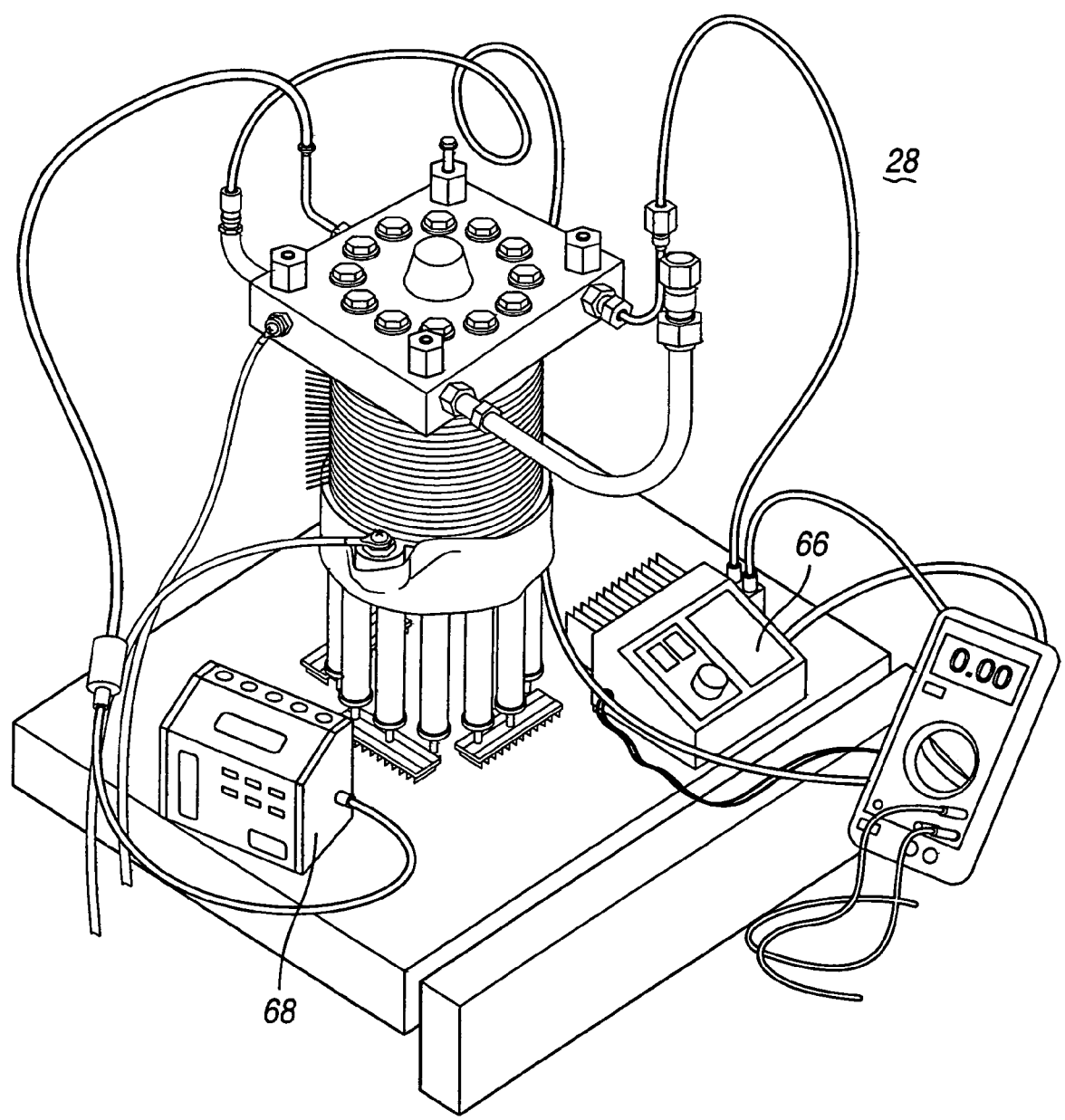
FIG. 5 represents the PEM electrolyzer according to the teachings of the present invention.

Before conducting outdoor tests in natural sunlight, the PEM electrolyzer subsystem 28 was tested in the laboratory using a variable output DC power supply (Hewlett Packard Model 6012B) to verify that the predicted hydrogen production rate calculated from the input current was equal to the hydrogen output measured with a pre-calibrated mechanical flow meter (Drycal™, Bios International Corp., Butler, Pa.) and that the volumetric ratio of hydrogen to oxygen produced was 2 to 1 (FIG. 5). Outdoor testing of PV-electrolysis systems in natural sunlight was done using the apparatus shown in FIGS. 1, 11 and 12.

The efficiency of solar energy conversion to hydrogen was calculated from the measured current going through the electrolyzer ($I_{oper}$), the solar intensity (irradiance) and the total area of the PV solar cells using Equation 1.

$$\text{Solar energy to } H_2 \text{ efficiency} = \frac{I_{oper}(A) \times N \times 1.23 \text{ volts} \times 100\%}{PV \text{ area } (m^2) \times \text{Solar Intensity } (W/m^2)} \quad \text{Equation 1}$$

where N=the number of cells in the electrolyzer (twenty in our test system).

The efficiency of the PV solar cells 24 for converting solar energy to electrical energy is a characteristic of the semiconductor layers used in their construction, which are multi or single crystalline silicon or have layers of crystalline and amorphous silicon combined. This efficiency ranged from 11.5% to 17.5% depending on the cell type (see Table 1). The electrolyzer efficiency for converting the electrical energy to hydrogen energy, operating voltage, and current are inherent properties of the electrolyzer, which depend on its design, catalysts, operating temperature, operating current, pressure, and condition of the PEM stack, including total previous hours of operation.

The overall solar hydrogen production efficiency of the PV-electrolyzer system 20 was determined experimentally under a range of voltages ($V_{mpp}$) using natural sunlight as shown in columns 3 and 5 of Table 2. The solar irradiance for the measurements in Table 2 was approximately 900-950 $W/m^2$, i.e., clear, sunny conditions.

TABLE 2

Direct Connection Optimization (DCO) of PV-Electrolysis Systems

| PV Modules Employed | Area of Solar cells ($m^2$) | $V_{mpp}$ (volts) | PV cell Efficiency at $V_{mpp}$ (%) | Solar Hydrogen Efficiency (%) |
|---|---|---|---|---|
| #3 | 0.566 | 17.0 | 13.3 | 0 |
| #8 | 1.042 | 20.0 | 13.4 | 0 |
| #8 + #9 parallel | 2.084 | 20.0 | 13.4 | 0 |
| #12 | 1.22 | 33.0 | 11.5 | 8.3 |
| #16 | 1.134 | 34.6 | 14.6 | 10.3 |
| #13 | 1.057 | 36.2 | 17.5 | 12.4 |
| #8 + #9 series | 2.084 | 40.0 | 13.4 | 8.5 |
| #11 | 1.040 | 51.4 | 16.1 | 9.3 |
| #10 + #11 parallel | 2.080 | 52.7 | 16.7 | 9.0 |
| #10 | 1.040 | 54.0 | 17.3 | 8.9 |
| #10 + #11 series | 2.080 | 105.4 | 16.7 | 4.4 |

Figure 8:
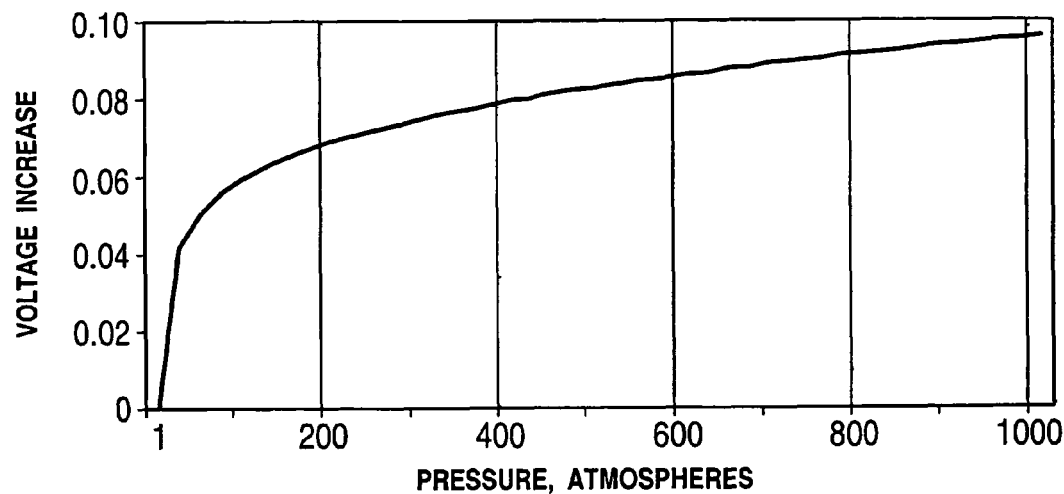
FIG. 8 represents the effect of $H_2$ pressure on the half-cell potential of the hydrogen evolution reaction.
Figure 9:
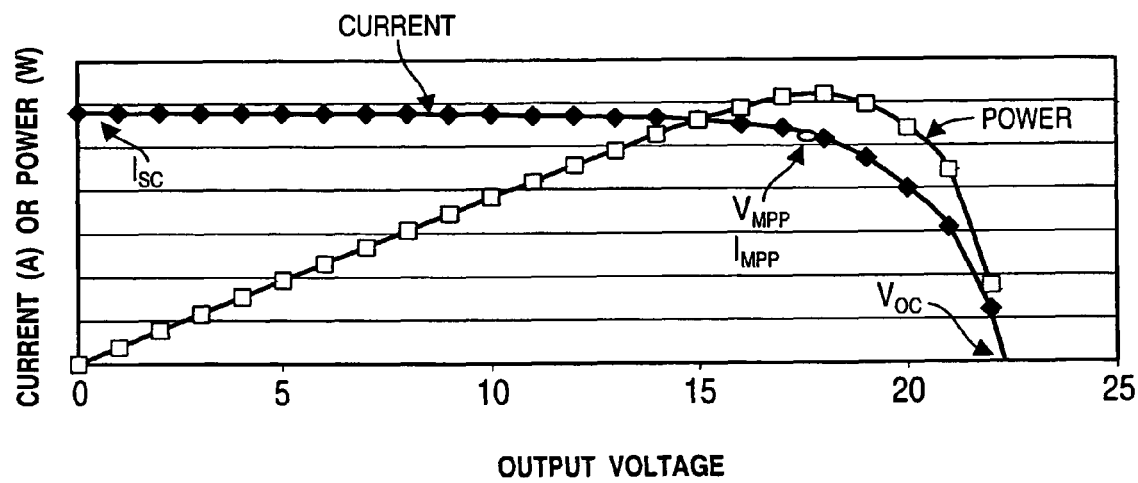
FIG. 9 represents current (I) versus voltage (V) for a photovoltaic module showing the Maximum Power Point (mpp). The corresponding power curve (P=V×I) is also shown.

The efficiency of the PEM-electrolyzer subsystem 28 was approximately 76% under the current (about 3-5 A) and temperature conditions of the PV-electrolyzer tests. The electrolyzer efficiency was not significantly affected by changes in electrolyzer temperature during the outdoor PV-electrolyzer tests because a nearly constant cool operating temperature was maintained (~25° C.). In a separate set of experiments, the electrolyzer efficiency was measured under a wider current range supplied by a DC power supply (FIG. 8). The electrolyzer efficiency decreased from 76% at an operating current of 5 A to approximately 65% efficiency at 70 A. The electrolyzer efficiency was determined from the operating voltage ($V_{oper}$) and the theoretical water splitting voltage of 1.23 volts and number of cells in series in the electrolyzer (20 cells) by the equation:

$$\text{Electrolyzer Efficiency}=100\% \times 1.23 \times 20/V_{oper}. \quad \text{Equation 2}$$

Figure 6:
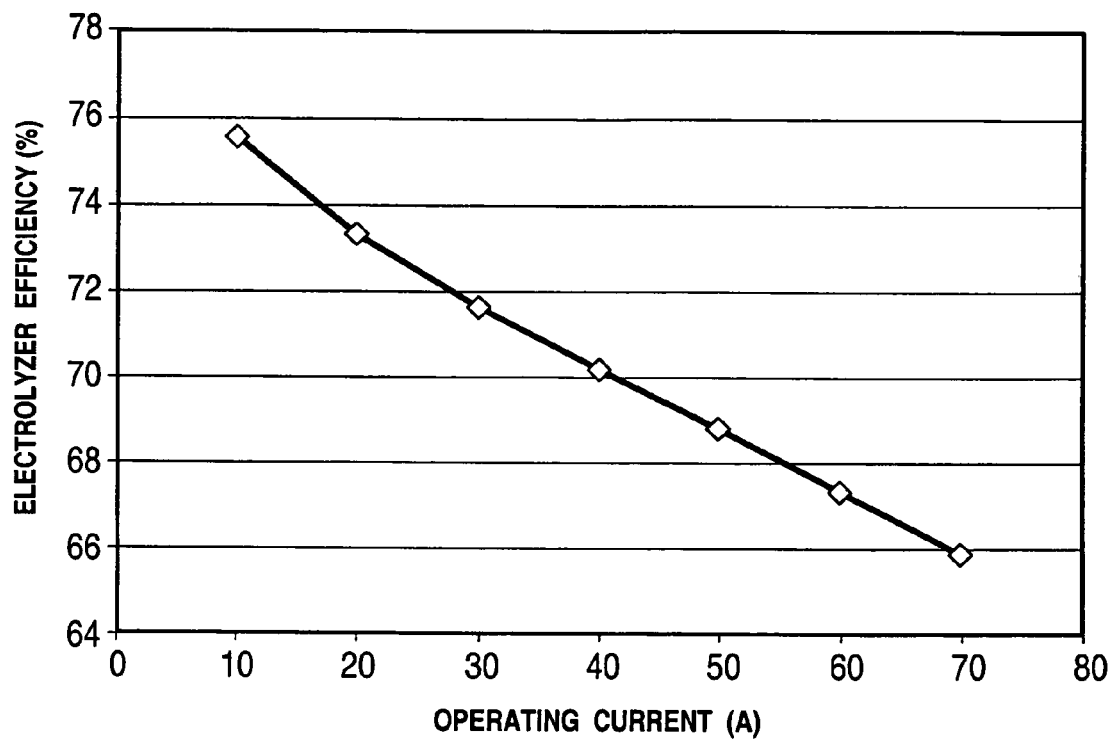
FIG. 6 represents the efficiency of the 20-cell PEM electrolyzer measured with a DC power supply over a range of operating currents.
Figure 7:
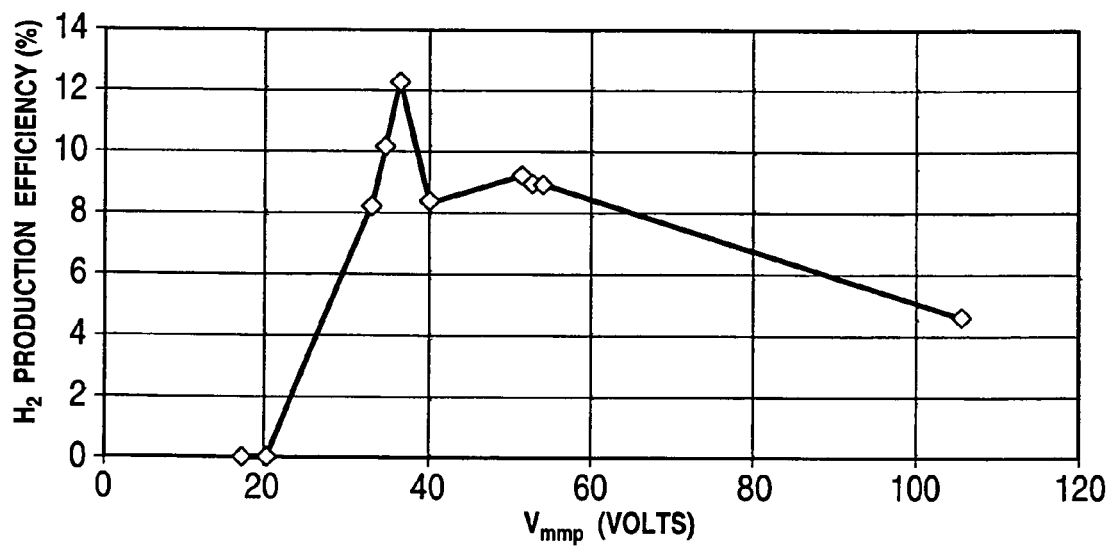
FIG. 7 represents the efficiency of solar energy to hydrogen conversion versus $V_{mpp}$ measured with DCO under natural sunlight conditions.

A plot of the electrolyzer efficiency data is shown in FIG. 6. The measured solar hydrogen production efficiency reached a maximum at $V_{mpp}$=36 volts (FIG. 7). Three of the PV subsystems #12, #16, and #13 have $V_{mpp}$ values close to the $V_{oper}$ of the electrolyzer. Thus, when they are used to drive the electrolyzer, the PV subsystems 22 are operating at about their $V_{mpp}$ and produce their maximum power and efficiency. The expected PV-electrolyzer efficiency using PV subsystem #13 would be higher than using #12 or #16 because the PV cell (electrical) efficiency (at MPP) measured under standard test conditions (STC) of 25° C. temperature and 1000 $W/m^2$ irradiance was 17.5% for #13, but only 11.5% and 14.6%, respectively, for #12 and #16. However, the actual PV cell (electrical) efficiencies are lower under operating conditions because of the negative power and efficiency effect of higher PV temperature on electrical output. At PV temperatures of 35° C. measured on the backs of the modules during the PV-electrolyzer tests, the estimated PV cell efficiencies were decreased to 95% of the above efficiency values at the STC, i.e., #13, 16.6%; #12, 10.9%; and #16, 13.9%.

If these actual PV efficiency values are inserted into the overall efficiency equation:

$$\text{Solar } H_2 \text{ Efficiency}=PV \text{ efficiency} \times \text{Electrolyzer efficiency} \quad \text{Equation 3}$$

Using an electrolyzer efficiency of 76% under electrolyzer current less than or equal to 10 A (FIG. 6), the following overall solar hydrogen efficiencies are expected: PV #13, 17.5%×0.95×0.76=12.6%; PV #12, 11.5%×0.95×0.76=8.3%; and PV #16, 14.6%×0.95×0.76=10.5%. These expected efficiency values are approximately equal to the values actually measured: PV #13-12.4%; PV 12-8.3%; and PV 16-10.3% (Table 2). Based on the test results, the PV-electrolyzer systems 20 gave optimum $H_2$-solar efficiency when the mpp voltage of the PV system was in the range of 32 to 39 volts, which closely matches the operating voltage range of the PEM electrolyzer (32 to 38 volts).

The experimental results from DDC optimization of PV-electrolysis measured under natural sunlight using the apparatus shown in FIG. 1 (schematic in FIG. 3) are summarized in Table 3. Two DDC devices designed to present invention specifications with special potentiometers to control the voltage and current output were used for optimizing PV-electrolyzer systems in these experiments and allowed for determining optimum voltage and current settings to increase electrolyzer efficiency: (1) Solar Converters, Inc. model PPT 48-10 for higher voltage PV subsystems designed to operate with an input voltage of 54-90 volts and reduce it to an output voltage of 31-36 volts, while increasing the output current to operate the PEM electrolyzer at optimum efficiency; and (2) model CV 20/33-20 for lower voltage PV subsystems designed to operate at an input voltage of 17-25 volts and increase it to the optimum output voltage of 31-36 volts. The low voltage DDC device increases both the operating voltage and the current since the electrolyzer $I_{oper}$ is zero until the voltage exceeds ~30 volts; i.e., the minimum voltage necessary before electrolysis can occur.

TABLE 3

DDC Optimization of PV-Electrolysis Systems Compared to DCO Operation

| PV Module | $V_{mpp}$ (volts) of PV System | DCO Solar $H_2$ Efficiency (%) | DDC Solar $H_2$ Efficiency (%) | DC-DC Converter Used | Solar Irradiance (W/m²) |
|---|---|---|---|---|---|
| #3 | 17.0 | 0 | 7.6 | CV 20/33-20 | 960 |
| #8 | 20.0 | 0 | 5.8 | CV 20/33-20 | 370 |
| #8 | 20.0 | 0 | 6.2 | CV 20/33-20 | 690 |
| #8 | 20.0 | 0 | 9.5 | CV 20/33-20 | 1000 |
| #10 | 54.0 | 9.0 | 8.5 | PPT 48-10 | 540 |
| #10 | 54.0 | 9.0 | 10.1 | PPT 48-10 | 770 |
| #10 | 54.0 | 9.0 | 10.5 | PPT 48-10 | 860 |

As shown in Table 3, PV subsystems 22, which have too low $V_{mpp}$ (17 or 20 volts) to make any hydrogen by direct connection PV-electrolysis, can be used with DDC optimization to raise the voltage and efficiently power the PEM electrolyzer. Likewise, a PV subsystem, which has too high $V_{mpp}$ (54 volts) to make hydrogen very efficiently by direct connection PV-electrolysis, operates the PEM electrolyzer more efficiently by using DDC optimization to lower the voltage and increase the efficiency from 9.0% to 10.5% even under reduced irradiance on partly cloudy days. All the PV systems in Table 3 showed increased solar to hydrogen efficiency with increases in the solar irradiance when using the DDC system.

To fuel a fuel cell powered automobile traveling 30 miles per day, which is a reasonable approximation for an average daily amount of driving in the U.S., approximately 0.5 kg of hydrogen per day would be needed. This approximation is based on the reported fuel efficiency of the GM/Opel Hydro-Gen3 fuel-cell vehicle.

The PEM electrolyzer stack with 20 electrolysis cells in series used as a hydrogen generator is capable of producing 0.5 kg/day hydrogen at 150 psig to supply a fuel cell vehicle driven a typical 30 miles/day.

The current needed to produce 500 grams of hydrogen in 6 hours of sunshine typical of a summer day is:

Current in A=(500 grams $H_2$/2 grams/mole $H_2$)×(96,500 coulombs/equivalent)×(2 equivalents of electrons/mole of $H_2$)×(1 A/1 coulomb/second)×(1 hour/3600 seconds)×1/(6 hour)×(1/20 cells)    Equation 4

Result: Current=110 A

Thus, 110 A at approximately 38 volts is needed, which is 4.2 kW of power to operate the electrolyzer system. Based on this, the present invention uses a 20-cell PEM stack in an integrated, optimized PV-electrolyzer system to generate hydrogen from the PV power. To produce hydrogen from the electrolyzer as efficiently and cheaply as possible, the solar PV array is sized to produce 110 A at 38 volts during the peak six hours of the daylight period. For summertime conditions in Detroit Mich., the peak sun hour value is approximately 6 hours (NREL Solar Radiation Data Manual for Flat-Plate and Concentrating Collectors, http://rredc.nrel.gov/solar/pubs/redbook/). The peak sun hours (PSH) represents the total daily solar energy equivalent to the number of hours per day with a solar irradiance of 1000 W/m², e.g., 6 PSH=6000 Wh/m² per day. To obtain this current and voltage input at the electrolyzer, a PV system with a maximum power point voltage ($V_{mpp}$) of approximately 38 volts is required for optimum efficiency to electrolyze water and overcome internal or external resistance and over voltage effects associated with the electrolyzer circuit.

From Table 2, the best direct connection module in terms of matching the $V_{mpp}$ of the module to voltage of the electrolyzer load is module #13 that produces 185 W under the standard sunlight condition (1000 W/m²). Although the $V_{mpp}$ of module #13 is listed as 36.2 volts, it produces more than 95% of its operating voltage at a load operating voltage ($V_{oper}$) of 38 volts. It would take approximately 22 of such modules wired in parallel to operate the electrolyzer at maximum output for the approximately six hours of peak sunshine in Detroit in the summertime. In the winter, when the solar insolation is less than half that in the summer, twice as many modules would be needed. One positive note about the winter performance—the modules would operate more efficiently since higher temperatures degrade their performance.

For summertime conditions, with six hours of peak sunshine, the electrolyzer would produce 83 g of hydrogen per hour. This translates to a hydrogen production of 0.50 kg/day sufficient to provide the fuel needed for one FCV by using solar power, one PV system consisting of 25 solar modules (22 modules to run the electrolyzer to make hydrogen and 3 additional modules to run a compressor to pressurize the hydrogen for storage and fueling vehicles), and one PEM electrolyzer of the type tested would be needed in the summer. Approximately twice as many modules would be needed in the winter. Each PV module has a cell area of 1.06 m². Thus: the total area=26.5 m², which is about 17'×17', needed to operate one PEM electrolyzer stack (20 cells).

A compressor is estimated to require at least 6% additional electric power to fill high pressure storage tanks with hydrogen for vehicle fueling (Simbeck D. R. and Chang E. (2002) "Hydrogen Supply: Cost Estimate for Hydrogen Pathways—Scoping Analysis." Report NREL/SR-540-32525. National Renewable Energy Laboratory, Golden, Colo.). Several high pressure metal diaphragm compressors are commercially available.

In an acidic electrolyte (the PEM is very acidic), the half-reactions describing hydrogen and oxygen evolution, respectively, are:

$2H^+ + 2e^- \rightarrow H_2$ reduction, cathode    Equation 5 and $H_2O \rightarrow 2H^+ + \tfrac{1}{2}O_2 + 2e^-$ oxidation, anode    Equation 6

Combining these two half reactions:

$H_2O \rightarrow H_2 + \tfrac{1}{2}O_2$    Equation 7

The Nernst equation describing the voltage of a cell combining these two half-reactions is:

$V = V_0 - ((R \times T)/(2 \times F)) \times \ln([H_2] \times [O_2]^{1/2}/[H_2O])$    Equation 8

(E. Gileadi, "Electrode Kinetics for Chemists, Chemical Engineers, and Materials Scientists," pp. 502-505, Wiley-VCH, Inc., 1993)

In equation 8, T is temperature in degrees K, R is the gas constant (8.314 volt coulombs/K mole), and F is the Faraday constant (96,484 coulombs/mole of electrons), and the $H_2$ and $O_2$ concentrations are equal to their pressures. The quantity $V_o$ is equal to −1.23 volts, $((R \times T)/(2 \times F))$ is equal to 0.0128 volts at 298° K, and the concentration of water is relatively independent of gas pressure and is taken as one since it is in it's standard state. Note; the sign on $V_o$ is negative since 1.23 volts is needed to split water; if the system was consuming $H_2$ and $O_2$ to produce electricity, the sign would be positive and the reaction would be spontaneous. If $[H_2]=[O_2]=1$ atmosphere, then $V=V_0=-1.23$ volts. If both $[H_2]$ and $[O_2]$ are increased to 10 atmospheres, then the term to the right of $V_0$ becomes −0.044 volts and the voltage needed to split water is −1.273 volts. This is a relatively small increase in "over voltage", at higher pressure, due to its inclusion in a logarithmic term, and provides an impetus for using a high-pressure electrolyzer to produce high-pressure hydrogen, versus a low pressure electrolyzer followed by a compressor. For higher pressures, one cannot simply use pressure in the Nernst equation, and the activity, called the fugacity for gases, needs to be used. The fugacity is approximately equal to the pressure at low pressures, but is higher than the pressure at very high pressures. The relationship between the voltage for the hydrogen evolution reaction and the hydrogen pressure has been measured for pressures up to 1000 atmospheres (W. R. Hainsworth, H. J. Rowley, and D. A. MacInnes, "The effect of hydrogen pressure on the electromotive force of a hydrogen-calomel cell. II. The fugacity of hydrogen and hydrogen ion at pressures to 1000 atmospheres," *J. Amer. Chem. Soc.*, Vol. 46, pp. 1437-1443, 1924). The empirical equation derived in Hainsworth et al. is:

$$\Delta V = 0.02958 \times \log(p) + 6.12 \times 10^{-6} \times (p-1) + 6.6 \times 10^{-10} \times (p^2-1) \quad \text{Equation 9}$$

In Equation 9, $\Delta V$ is the voltage increase needed to drive the hydrogen evolution reaction at higher hydrogen pressures and p is the pressure in atmospheres. A plot of this relation is shown in FIG. 8.

At 1000 atmospheres of hydrogen, the voltage for the hydrogen evolution reaction is increased by approximately 0.1 volt. It may be possible to vent the oxygen in a PEM electrolyzer, and thus prevent the over voltage due to its pressurization, but if not, the oxygen evolution voltage would also be increased. If it were necessary to maintain an equal high pressure on the oxygen side of the PEM electrolyzer (the volume of the cell where oxygen is produced would have to be half that of the hydrogen, since only half as much oxygen is produced), then there would also be an increase in the voltage needed for the oxygen evolution reaction (Equation 6). The oxygen fugacity is approximately 16% higher than its pressure at 1000 atmospheres, so the value of the $[O_2]$ term at 1000 atmospheres is 1164 atmospheres. (TRC Thermodynamic Tables, Non-Hydrocarbons, Standard Reference Data Base, National Institute of Standards and Technology, Gaithersburg, Md. 20899, web address http://trc.nist.gov/tables/nonhydro.htm). Thus, the value of the oxygen over voltage effect based on Equation 8 is $0.0128 \times \ln(1160^{0.5})$ that equals 0.045 volts. Thus, it is estimated that the total over voltage for the electrolysis of water, Equation 7, at 1000 atmospheres of hydrogen and oxygen is approximately 0.14 volts. This is a weak dependence of the over voltage on pressure; i.e., the over voltage due to the high pressurization of both gases is less than that due to kinetic effects at the oxygen electrode, which is 0.3-0.4 volts even for the best of catalysts at the present time. The effect of this over voltage at 1000 atmospheres is to increase the energy needed for electrolysis by approximately 9% (100×0.14 volts/1.6 volts).

In summary, high-pressure electrolysis may be an attractive source of hydrogen pressurized to 1000 atmospheres due to the relatively weak dependence of the electrochemical reaction on pressure, and the simplicity of performing the synthesis and pressurization in one step.

The voltage (V), current (I), and power (P) data of the solar modules were measured and the maximum power point (mpp) was determined using the method illustrated in FIG. 11. The mpp voltage must closely match the characteristic operating voltage of the electrolyzer to optimize the overall efficiency of solar energy conversion to hydrogen fuel energy. The I, V, and P curves (FIG. 11) are normally measured under standard test conditions (25° C., 1000 W/m² irradiance, and AM1.5 global solar spectrum) to determine the "standard" values of open circuit voltage ($V_{oc}$), short circuit current ($I_{sc}$), voltage at the mpp ($V_{mpp}$), and current at the mpp ($I_{mpp}$). These quantities are also measured for a range of other temperatures and solar irradiance levels to determine the effects of variations in temperature and sunlight on PV system performance.

The system described herein provides a cost-effective, non-polluting and renewable source of hydrogen fuel for fuel cell vehicles and stationary fuel cell power production. Note that the present optimized PV-electrolysis system has a maximum efficiency of about 12.4% near one sun irradiance (1000 W/m²). This is approximately noon time sun on a cloud-free day in the summer in the northern United States. This is the highest reported efficiency of solar energy conversion to hydrogen fuel. Many parts of the United States can provide approximately 6-8 hours at such levels for more than six months of the year. For such conditions, the present invention provides a practical means of supplying renewable, non-polluting hydrogen fuel for fuel cells. Although the benefits are greater in the desert southwest and sunbelt areas, the system operates effectively in other sections of the United States and its efficiency may be increased on partly-cloudy days due to the addition of DC-DC conversion optimization to make hydrogen under low light conditions. When used in areas with lower average sunshine (insolation), a greater area of PV subsystems would be needed to supply a given fuel requirement.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention. For example, power to the DC to DC converter cans be supplied by alternate energy sources including but not limited to the power grid, wind power or a fuel cell that consumes hydrogen generated by the electrolyzer and that supplies current to a load. Additionally, the electrolyzer subsystem 28 can be configured as a reversible electrolyzer/fuel cell system, i.e., to operate in a first mode to electrolyze water to produce hydrogen and wherein the electrolyzer subsystem 28 is operable in a second mode to consume hydrogen to produce power. Optimization techniques as described herein are applicable to a variety of electrolyzers, including: (i) an acidic electrolyzer having an acidic electrolyte; (ii) a basic electrolyzer having a basic electrolyte; (iii) a steam electrolyzer; (iv) a PEM electrolyzer comprising at least one MEA; and (v) a high-pressure electrolyzer. As used herein, the term "PV subsystem" refers to one or more PV cells or modules.

What is claimed is:
1. A photovoltaic electrolyzer system comprising:
an electrolyzer subsystem;
a DC-DC converter configured to selectively provide energy to an electrolyzer power input;
a photovoltaic subsystem for selectively providing energy directly to the electrolyzer power input or to the DC-DC converter;
a controller for intermittently selecting only one of the photovoltaic subsystem along a first current path or the DC-DC converter as a power source along a second current path, to the power input of the electrolyzer in response to varying light conditions; and wherein the electrolyzer subsystem is configured to electrolyze water to generate hydrogen at greater than a predetermined efficiency between a first and second operating voltages, and wherein said photovoltaic subsystem is configured to provide electric power at a voltage between the first and second operating voltages, wherein the electrolyzer subsystem consists of a plurality of electrolysis cells which are connected together in at least one of a series connection, to accept a higher operating voltage, and a parallel connection, to accept a higher operating current.

2. The photovoltaic electrolyzer system of claim 1, wherein the photovoltaic subsystem consists of a plurality of solar cells, which are connected together in at least one of a series connection, to generate higher voltage, and a parallel connection, to generate higher current.

3. The photovoltaic electrolyzer system of claim 1, wherein the said electrolyzer subsystem has an electrolysis cell selected from the group consisting of a proton exchange membrane (PEM) electrolyzer, a high pressure electrolyzer, an alkaline electrolyzer having a basic electrolyte, an acidic electrolyzer having an acidic electrolyte, a steam electrolyzer, a reversible PEM fuel cell/electrolyzer, and combinations thereof.

4. The photovoltaic electrolyzer system of claim 1, wherein the photovoltaic subsystem is configured to generate a predetermined voltage at a maximum power point at about the operating voltage of the electrolyzer subsystem, so that the hydrogen generation is optimized and achieves maximum efficiency at a predetermined solar irradiance at a predetermined temperature.

5. The photovoltaic electrolyzer system of claim 4, wherein the photovoltaic subsystem has a $V_{mpp}$ of about 36 volts DC and a solar to electrical efficiency of about 17.5%, and wherein the photovoltaic subsystem is connected to a high efficiency PEM electrolyzer having 20 electrolysis cells in series with a $V_{oper}$ of between about 32 volts and about 38 volts DC.

6. The photovoltaic electrolyzer system of claim 1, wherein the electrolyzer comprises a plurality of electrolysis cells and the PV subsystem has a predetermined output voltage in a range between about 1.6 volts DC per electrolysis cell and about 2.0 volts DC per electrolysis cell.

7. The photovoltaic electrolyzer system of claim 1, wherein the photovoltaic subsystem generates about 95% to 100% of its maximum power output with about 95% to 100% of its maximum electrical efficiency and about 85% to 100% of its maximum solar energy to hydrogen conversion efficiency.

8. The photovoltaic electrolyzer system of claim 1, wherein the electrolyzer subsystem has a characteristic operating voltage determined by measuring the voltage drop across the poles of the electrolyzer subsystem at known operating current.

9. The photovoltaic electrolyzer system of claim 1, wherein the electrolyzer subsystem comprises a plurality of electrolysis cells and has a characteristic operating voltage $V_{oper}$ determined by its number (N) of electrolysis cells in series and a characteristic overvoltage of each electrolysis cells ($V_{ov}$) such that:

$$V_{oper} = N \times (1.23 \text{ volts} + V_{ov})$$

in which $V_{ov}$ ranges from about 0.4 to 0.7 volts DC.

10. The photovoltaic electrolyzer system of claim 1, further comprising a DC-DC converter coupled to the photovoltaic subsystem and the electrolyzer, the DC-DC converter being configured to convert the output voltage of the PV subsystem to a voltage in the range between the first and second voltages.

11. The photovoltaic electrolyzer system of claim 10, wherein the electrolyzer subsystem comprises a plurality of electrolysis cells and the DC-DC converter is configured to convert the voltage output of the photovoltaic subsystem to between 1.6 and 2.0 volts DC per electrolysis cell.

12. A photovoltaic electrolyzer system comprising:
an electrolyzer having a power input, the electrolyzer being configured to disassociate $H_2O$ into $H_2$ and $O_2$;
a DC-DC converter configured to selectively provide energy to an electrolyzer power input;
a photovoltaic subsystem for selectively providing energy directly to the electrolyzer power input or to the DC-DC converter; and
a controller for intermittently selecting only one of the photovoltaic subsystem along a first current path or the DC-DC converter alone a second current path, as a power source to the power input of the electrolyzer in response to varying light conditions.

13. The photovoltaic electrolyzer system according to claim 12 wherein the electrolyzer is configured to electrolyze water to generate hydrogen at greater than a predetermined efficiency between first and second operating voltages, and wherein said photovoltaic subsystem is configured to provide electric power at a voltage between the first and second operating voltage under predetermined solar conditions.

14. The photovoltaic electrolyzer system according to claim 12 wherein the electrolyzer is configured to electrolyze water to generate hydrogen at greater than a predetermined efficiency between first and second operating voltages, and wherein said DC-DC converter is configured to provide electric power at a voltage between the first and second operating voltage.

15. The photovoltaic electrolyzer system according to claim 13 wherein the PV subsystem comprises a solar cell having a crystalline silicon, amorphous silicon, copper indium diselenide, cadmium telluride, or combinations thereof.

16. The photovoltaic electrolyzer system according to claim 12 wherein the electrolyzer subsystem is designed to operate at a pressure between about 5,000 psi and about 15,000 psi to produce hydrogen at a pressure between about 5,000 psi and about 15,000 psi.

17. The photovoltaic electrolyzer system according to claim 12 wherein the electrolyzer subsystem is configured to operate at a current density below 1.1 $A/cm_2$.

18. The photovoltaic electrolyzer system according to claim 12 comprising a cooling system coupled to the PV subsystem.

19. A method for disassociating water to form hydrogen, the method comprising:
providing an electrolyzer subsystem having a power input, the electrolyzer being configured to disassociate $H_2O$ into $H_2$ and $O_2$;
providing a DC-DC converter configured to selectively provide energy directly to an electrolyzer power input;
providing a photovoltaic subsystem configured to selectively provide energy directly to the electrolyzer power input and to the DC-DC converter; and
intermittently selecting only one of direct power from the photovoltaic subsystem through a first current path or the DC-DC converter as a power source through a second current path to the power input of the electrolyzer, based on the energy detected by a solar irradiance sensor.

20. The method of claim 19, wherein providing a photovoltaic subsystem is providing solar cells connected in series.

21. The method of claim 19, wherein providing an electrolyzer subsystem is providing an electrolyzer subsystem consisting of a plurality of electrolysis cells connected in series.

22. The method of claim 19, wherein providing an electrolyzer subsystem is providing electrolyzer subsystem comprising an electrolysis cell selected from the group of
    (i) a proton exchange membrane (PEM) electrolyzer,
    (ii) a high pressure electrolyzer,
    (iii) an alkaline electrolyzer having a basic electrolyte,
    (iv) an acidic electrolyzer having an acidic electrolyte,
    (v) a steam electrolyzer, and
    (vi) a reversible PEM fuel cell/electrolyzer.

23. The method of claim 19, wherein providing an electrolyzer subsystem is providing a subsystem configured to generate hydrogen at greater than a predetermined efficiency between predetermined first and second operating voltages, and wherein providing a photovoltaic subsystem is providing a photovoltaic subsystem configured to provide electric power at a voltage between the predetermined first and second operating voltage at the maximum power point of the photovoltaic subsystem or under predetermined solar conditions.

24. The method of claim 19, wherein providing an electrolyzer subsystem is providing a subsystem configured to generate hydrogen at greater than a predetermined efficiency between a first and second operating voltages, and wherein providing a DC-DC converter is providing a DC-DC converter configured to provide electric power at a voltage between the first and second operating voltage under predetermined solar conditions.

25. The method of claim 19, wherein providing an electrolyzer is providing an electrolyzer having a plurality of electrolysis cells and wherein providing a PV subsystem is providing a PV subsystem having an output voltage between about 1.6 and about 2.0 volts DC per electrolysis cell.

26. The method of claim 19, wherein the PV subsystem is configured to generate between about 95% to 100% of $P_{max}$, so as to give about 95% to 100% of its maximum electrical efficiency, and wherein the PV-electrolyzer system has a hydrogen generation efficiency from about 85% to 100% of a maximum hydrogen generation efficiency.

27. The method of claim 19 wherein providing an electrolyzer subsystem is providing a subsystem configured to generate hydrogen at greater than a predetermined efficiency between a first and second operating voltages, and wherein providing a photovoltaic subsystem is providing a photovoltaic subsystem configured to provide electric power at one of a voltage lower than the first operating voltage and a voltage greater than the second operating voltage under predetermined solar conditions.

28. The method of claim 19, wherein electrolyzer subsystem comprises a plurality of electrolysis cells and wherein the DC-DC converter is configured to convert the voltage output of the PV subsystem to between 1.6 and 2.0 volts DC per electrolysis cell.

29. The method of claim 19, wherein providing an electrolyzer subsystem is providing an electrolyzer subsystem configured to operate at pressures between about 5,000 psi and about 15,000 psi.

30. A method for operating an electrolysis system having at least one photovoltaic (PV) cell, supplying power to electrolyze water to produce hydrogen, the method comprising:
    a) determining the operating voltage, operating current, and efficiency of the electrolyzer subsystem by measurements and calculations;
    b) determining a maximum power point voltage ($V_{mpp}$) for said PV cell based on a predetermined relationship between actual voltage and actual current under a plurality of loads and a plurality of voltages for said PV cell;
    c) determining a number of PV cells at said $V_{mpp}$ to achieve an optimal voltage to electrolyze water and satisfy required electrolysis system losses; and
    d) providing a controller to selectively electrically couple only one of the PV cell directly to the electrolyzer subsystem through a first current path or the PV cell through a DC-DC converter through a second current path to the electrolyzer subsystem in response to a signal from an irradiance sensor.

31. A method for operating an electrolysis system having at least one photovoltaic (PV) subsystem supplying power to electrolyze water to produce hydrogen, comprising:
    a) determining the operating voltage, operating current, and efficiency of the electrolyzer subsystem by measurements and calculations;
    b) determining a maximum power point voltage ($V_{mpp}$) for said PV cell based on a predetermined relationship between actual voltage and actual current under a plurality of loads and a plurality of voltages for said PV cell; and
    c) determining a number of PV cells at said $V_{mpp}$ to achieve a desired voltage to electrolyze water and satisfy the required losses for the electrolysis system providing a controller to selectively electrically couple one of the PV cell directly to the electrolyzer subsystem through a first current path, or the PV cell through a DC-DC converter via a second current path to the electrolyzer subsystem in response to a signal from an irradiance sensor, and wherein said electrolysis system comprises an electrolyzer selected from:
        (i) an acidic electrolyzer having an acidic electrolyte;
        (ii) a basic electrolyzer having a basic electrolyte;
        (iii) a steam electrolyzer;
        (iv) a PEM electrolyzer comprising at least one electrolysis cell; and
        (v) a high-pressure electrolyzer.

* * * * *